(12) United States Patent
Matsukura et al.

(10) Patent No.: US 7,790,811 B2
(45) Date of Patent: Sep. 7, 2010

(54) PELLICLE AND NOVEL FLUOROPOLYMER

(75) Inventors: Ikuo Matsukura, Yokohama (JP);
Hiromasa Yamamoto, Yokohama (JP);
Yuichiro Ishibashi, Yokohama (JP);
Shinji Okada, Yokohama (JP); Naoko Shirota, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 1129 days.

(21) Appl. No.: 11/446,242

(22) Filed: Jun. 5, 2006

(65) Prior Publication Data

US 2006/0240222 A1    Oct. 26, 2006

Related U.S. Application Data

(63) Continuation of application No. PCT/JP2004/017965, filed on Dec. 2, 2004.

(30) Foreign Application Priority Data

| Dec. 3, 2003 | (JP) | ............................. 2003-404403 |
| Apr. 15, 2004 | (JP) | ............................. 2004-120237 |
| Aug. 2, 2004 | (JP) | ............................. 2004-225707 |

(51) Int. Cl.
*C08F 114/18* (2006.01)
(52) U.S. Cl. ................. 525/326.2; 525/326.8; 526/247; 428/138; 428/421
(58) Field of Classification Search ............. 525/326.2, 525/326.8; 526/247; 428/138, 421
See application file for complete search history.

(56) References Cited

U.S. PATENT DOCUMENTS

| 4,594,399 | A | * | 6/1986 | Anderson et al. ............ 526/247 |
| 5,356,739 | A | | 10/1994 | Kawasaki et al. |
| 5,510,406 | A | | 4/1996 | Matsuo et al. |
| 6,548,129 | B2 | | 4/2003 | Matsukura et al. |
| 6,660,346 | B2 | | 12/2003 | Matsukura et al. |
| 6,770,404 | B1 | | 8/2004 | Wheland et al. |
| 6,803,488 | B2 | * | 10/2004 | Okazoe et al. ............... 568/600 |
| 6,824,930 | B1 | | 11/2004 | Wheland et al. |
| 6,960,381 | B2 | | 11/2005 | Matsukura et al. |

| 2004/0048005 | A1 | | 3/2004 | Matsukura et al. |
| 2005/0147897 | A1 | | 7/2005 | Matsukura et al. |

FOREIGN PATENT DOCUMENTS

| JP | 03-039963 | * | 2/1991 |
| JP | 3-39963 | | 2/1991 |
| JP | 03-067262 | * | 3/1991 |
| JP | 3-67262 | | 3/1991 |
| JP | 04-189880 | * | 7/1992 |
| JP | 4-189880 | | 7/1992 |
| JP | 4-226177 | | 8/1992 |
| JP | 6-220232 | | 8/1994 |
| JP | 11-209685 | * | 8/1999 |
| JP | 2000-74892 | | 3/2000 |
| JP | 2001-255643 | | 9/2001 |
| JP | 2001-330943 | | 11/2001 |
| JP | 02-48085 A1 | * | 6/2002 |
| WO | WO 01/37044 | | 5/2001 |
| WO | WO 02/18314 | | 3/2002 |
| WO | WO 02/48085 | | 6/2002 |
| WO | WO 02/093261 | | 11/2002 |
| WO | WO 2004/088422 | | 10/2004 |

OTHER PUBLICATIONS

U.S. Appl. No. 07/531,166, filed May 31, 1990, Kawasaki, et al.
T. I. Filyakova, et al. "Synthesis of Perfluoro- and 2-Trifluoromethylpentafluoro-dihydrofurans and Their Epoxy Derivatives" Russian Journal of Organic Chemistry, vol. 39, No. 7, Jul. 2003.

* cited by examiner

*Primary Examiner*—Peter D. Mulcahy
*Assistant Examiner*—Henry Hu
(74) *Attorney, Agent, or Firm*—Oblon, Spivak, McClelland, Maier & Neustadt, L.L.P.

(57) ABSTRACT

A useful fluoropolymer excellent in transparency and durability to a short wavelength light (an ArF excimer laser having an irradiation wavelength of 193 nm and a F2 excimer laser having an irradiation wavelength of 157 nm) as e.g. a pellicle material, wherein a polymer (I) to be used for a pellicle membrane and/or an adhesive is a polymer essentially containing the following fluorine atom-containing unit (1), wherein a chain forming the polymer main chain comprises a carbon atom and an etheric oxygen atom, at least one carbon atom forming the main chain is a carbon atom forming a cyclic group, and at least one etheric oxygen atom forming the main chain is an oxygen atom forming no cyclic group.

2 Claims, No Drawings

PELLICLE AND NOVEL FLUOROPOLYMER

TECHNICAL FIELD

The present invention relates to a novel pellicle having excellent transparency and durability to a short wavelength light, and a novel fluoropolymer.

BACKGROUND ART

A pellicle is used so as to prevent dust particles from depositing on a photomask or a reticle (hereinafter they will be referred to as a mask pattern surface) used in photolithography (exposure treatment) as a step in production of semiconductor devices or liquid crystal display panels. A pellicle is an optical article comprising a transparent thin membrane (hereinafter referred to as a pellicle membrane) bonded to a frame by means of an adhesive, to be mounted on the mask pattern at some distance from the mask surface. A pellicle is required to have transparency to a light to be used for the exposure treatment, durability and mechanical strength.

In production of semiconductor devices and liquid crystal display panels, minimization of wiring and wiring interval is in progress. For wiring processing with a minimum pattern dimension of at most 0.3 μm, a KrF excimer laser having an irradiation wavelength of 248 nm is used as a light source for the exposure treatment. As a material of a pellicle in the exposure treatment, a fluoropolymer having a saturated cyclic structure in its main chain has been known (Patent Documents 1 and 2).

In recent years, wiring processing with a minimum pattern dimension of at most 0.2 μm has been required, and it has been studied to use, as a light source for the exposure treatment, an excimer laser having an irradiation wavelength of at most 200 nm (such as an ArF excimer laser light having an irradiation wavelength of 193 nm or a $F_2$ excimer laser light having an irradiation wavelength of 157 nm). Particularly for wiring processing with a minimum pattern dimension of at most 0.07 μm, a $F_2$ excimer laser light is considered to be most promising, but the above fluoropolymer has no sufficient transparency and durability thereto. Also the adhesive to fix the pellicle membrane to the frame has had a similar problem due to reflected light or scattering light of the laser light.

Further, as another pellicle material, (1) a fluororesin having an ether bond at a moiety forming the main chain in the repeating structure and containing no cyclic structure (Patent Document 3) and (2) a substantially linear fluoropolymer comprising as the main chain a chain of carbon atoms (Patent Document 4) have been proposed.

Patent Document 1: JP-A-3-39963
Patent Document 2: JP-A-3-67262
Patent Document 3: JP-A-2001-255643
Patent Document 4: JP-A-2001-330943

DISCLOSURE OF THE INVENTION

Problems that the Invention is to Solve

However, the fluororesin (1) is practically oily or greasy, and it will hardly be formed into a self-supporting membrane which can be used as a pellicle membrane. Further, even if a high molecular weight compound is produced to form a self-supporting membrane, as its glass transition point is low, the membrane will sag or be broken due to a heat to be generated by the exposure treatment.

Further, the fluoropolymer (2) has transparency to a $F_2$ excimer laser light but has insufficient durability.

Means of Solving the Problems

The present inventors have found that a novel fluorinated polymer (I) having an etheric oxygen atom in its main chain and having a cyclic structure containing a carbon atom in its main chain, has sufficient durability and transparency to an excimer laser light, and also has heat resistance, mechanical strength and membrane-forming properties. They have further found that such a polymer is useful for a pellicle membrane and an adhesive for a pellicle.

Namely, the present invention provides the following:

<1> A pellicle for an exposure treatment, comprising a pellicle membrane bonded to a frame by means of an adhesive, wherein a polymer (I) to be used for the pellicle membrane and/or the adhesive is a polymer essentially containing the following unit (1):

unit (1): a unit containing a fluorine atom bonded to a carbon atom, wherein a chain forming the polymer main chain comprises a carbon atom and an etheric oxygen atom, at least one carbon atom forming the main chain is a carbon atom forming a cyclic group, and at least one etheric oxygen atom forming the main chain is an oxygen atom forming no cyclic group.

<2> The pellicle according to <1>, wherein the unit (1) is a unit represented by the following formula (A), a unit represented by the following formula (B), a unit represented by the following formula (C), or a unit represented by the following formula (D), provided that in the respective units represented by the following formulae, one to two carbon atoms forming the ring may be substituted by an etheric oxygen atom, and at least one hydrogen atom bonded to a carbon atom forming the ring may be substituted by a fluorine atom or a monovalent fluorinated organic group, or two hydrogen atoms bonded to carbon atom(s) forming the ring may together form a bivalent fluorinated organic group:

wherein each of $E^1$, $E^2$, $E^3$ and $E^4$ which are independent of one another, is a single bond or —$CF_2$—, and each of $K^1$, $K^2$, $K^3$ and $K^4$ which are independent of one another, is —O— or —$CF_2O$—.

<3> The pellicle according to <1> or <2>, wherein the polymer (I) is a polymer containing at least one type of the unit (1) or a polymer containing at least one type of the unit (1) and at least one type of a unit other than the unit (1).

<4> The pellicle according to any one of <1> to <3>, wherein the etheric oxygen atom forming the main chain present in the unit (1) is an oxygen atom bonded to a carbon atom to which no hydrogen atom is bonded.

<5> The pellicle according to any one of <1> to <4>, wherein the unit other than the unit (1) is a unit containing a fluorine atom.

<6> The pellicle according to <1>, wherein the unit (1) is a unit represented by the following formula (A1):

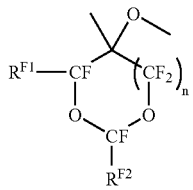
(A1)

wherein n is 1 or 2, $R^{F1}$ is a fluorine atom or a trifluoromethyl group, and $R^{F2}$ is a fluorine atom or a $C_{1-5}$ perfluoroalkyl group.

<7> The pellicle according to <1>, wherein the unit (1) is a unit represented by the following formula (A2) or a unit represented by the following formula (A3):

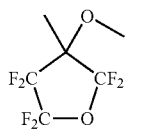
(A2)

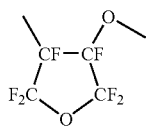
(A3)

<8> The pellicle according to <6> or <7>, wherein the polymer (I) contains at least one member selected from the unit represented by the formula (A1) to the unit represented by the formula (A3), or contains at least one member selected from the unit represented by the formula (A1) to the unit represented by the formula (A3) and at least one member selected from units other than the unit represented by the formula (A1) to the unit represented by the formula (A3).

<9> The pellicle according to <8>, wherein the unit other than the unit represented by the formula (A1) to the unit represented by the formula (A3) is at least one unit selected from units represented by the following formulae (M1) to (M5):

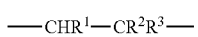
(M1)

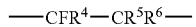
(M2)

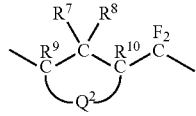
(M3)

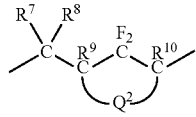
(M4)

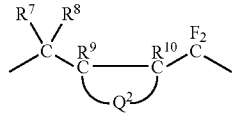
(M5)

wherein each of $R^1$, $R^2$ and $R^3$ which are independent of one another, is a hydrogen atom, a fluorine atom or a saturated monovalent fluorinated organic group, provided that at least one selected from $R^1$, $R^2$ and $R^3$ is a fluorine atom or a saturated monovalent fluorinated organic group, or two groups selected from $R^1$, $R^2$ and $R^3$ together form a bivalent fluorinated organic group and the other one group is a hydrogen atom, a fluorine atom or a saturated monovalent fluorinated organic group;

each of $R^4$, $R^5$ and $R^6$ which are independent of one another, is a fluorine atom or a saturated monovalent fluorinated organic group, or two groups selected from $R^4$, $R^5$ and $R^6$ together form a bivalent fluorinated organic group and the other one group is a fluorine atom or a saturated monovalent fluorinated organic group;

each of $R^7$, $R^8$, $R^9$ and $R^{10}$ which are independent of one another, is a hydrogen atom, a fluorine atom or a monovalent fluorinated organic group; and $Q^2$ is a bivalent fluorinated organic group.

<10> The pellicle according to any one of <1> to <9>, wherein the polymer (I) used for the pellicle membrane is a polymer having no functional group, and the polymer (I) used for the adhesive is a polymer having a functional group.

<11> An exposure treatment method, which comprises carrying out an exposure treatment by using the pellicle as defined in any one of <1> to <10>.

<12> An exposure treatment method by means of a light having a wavelength of at most 200 nm in photolithography, which comprises using the pellicle as defined in any one of <1> to <10>.

<13> The exposure treatment method according to <12>, wherein the light having a wavelength of at most 200 nm is a fluorine gas excimer laser light.

<14> A polymer containing a monomer unit represented by the following formula (A1) (wherein n, $R^{F1}$ and $R^{F2}$ are as defined above):

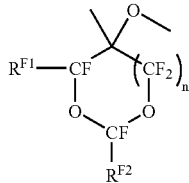
(A1)

<15> The polymer according to <14>, which has a mass average molecular weight of from 500 to 1,000,000.

<16> A method for producing a polymer containing a monomer unit represented by the formula (A1), which comprises polymerizing a compound represented by the following formula (a1) (wherein n, $R^{F1}$ and $R^{F2}$ are as defined above):

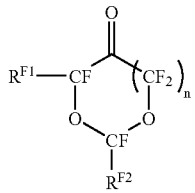
(a1)

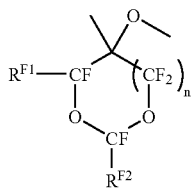
(A1)

<17> A compound represented by the following formula (a2) or a compound represented by the following formula (a3):

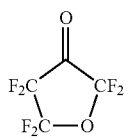
(a2)

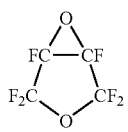
(a3)

<18> A polymer containing a monomer unit represented by the following formula (A2), or a polymer containing a monomer unit represented by the following formula (A3):

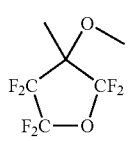
(A2)

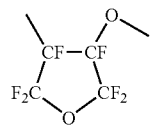
(A3)

<19> The polymer according to <18>, which has a mass average molecular weight of from 500 to 1,000,000.

<20> A method for producing a polymer containing a monomer unit represented by the following formula (A2), is which comprises polymerizing a compound represented by the following formula (a2):

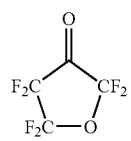
(a2)

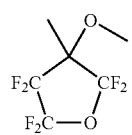
(A2)

<21> A method for producing a polymer containing a monomer unit represented by the following formula (A3), which comprises polymerizing a compound represented by the following formula (a3):

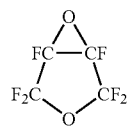
(a3)

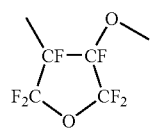
(A3)

Effects of the Invention

The pellicle of the present invention is a pellicle employing a novel fluorinated polymer (I), and has high transparency and durability to a light (hereinafter referred to as a short wavelength light) having an irradiation wavelength of at most 200 nm. The polymer (I) is capable of forming a membrane having excellent heat resistance and membrane-forming properties, and a pellicle to be obtained is thereby a useful pellicle excellent also in such properties.

BEST MODE FOR CARRYING OUT THE INVENTION

In this specification, a compound represented by the formula (a1) will be also referred to as a compound (a1). The same applies to the compounds represented by other formulae. Further, a unit represented by the formula (A1) will be referred to as a unit (A1). The unit in the polymer means the major constituting unit (also referred to as monomer unit) derived from a monomer formed by polymerization of the monomer. The unit in the present invention may be a monomer unit directly formed by polymerization or may be a unit (also referred to as a structural repeating unit) formed by a chemical conversion other than polymerization.

In this specification, a group having at least one hydrogen atom bonded to a carbon atom substituted by a fluorine atom is represented by prefixing "polyfluoro" to the name of the group. In a polyfluoro group, a hydrogen atom may or may not be present. A group having substantially all hydrogen atoms bonded to carbon atoms substituted by fluorine atoms is represented by prefixing "perfluoro" to the name of the group. In a perfluoro group, substantially no hydrogen atom is present.

In the present invention, in a pellicle for an exposure treatment comprising a pellicle membrane bonded to a frame by means of an adhesive, a polymer (I) essentially containing a specific unit (1) is used for the pellicle membrane and/or the adhesive.

The unit (1) is a unit containing a fluorine atom bonded to a carbon atom (i.e. a F atom in a C—F structure). The carbon atom to which the fluorine atom is bonded may be a carbon atom forming the polymer main chain or a carbon atom other than such as carbon atom. The polymer (I) is a fluorinated polymer essentially having a C—F structure.

The polymer main chain is the longest chain in the polymer molecule. Further, the chain forming the polymer main chain in the unit (1) is a chain with the minimum number of atoms among chains separating the bonds extending from the monomer unit. If two or more chains with the same number of atoms are present, both are the polymer main chains.

In the present invention, the chain forming the polymer main chain in the unit (1) comprises an etheric oxygen atom (i.e. —O—) and a carbon atom. At least one etheric oxygen atom forming the main chain is an oxygen atom forming no cyclic group. By the presence of an etheric oxygen atom forming no cyclic group, the polymer (I) in the present invention will have high properties such as transparency and durability to a light (particularly an ultraviolet light having a wavelength of at most 200 nm) to be used for the exposure treatment.

Further, at least one carbon atom forming the main chain of the polymer (I) is a carbon atom forming a cyclic group. All the hydrogen atoms forming the main chain may be carbon atoms forming a cyclic group, or some may be carbon atoms forming a cyclic group and the other are carbon atoms forming no cyclic group. In the present invention, it is preferred that one or two carbon atoms forming the main chain are carbon atoms forming a cyclic group. The cyclic group containing the main chain is preferably a 5-membered or 6-membered cyclic group as described hereinafter. By the carbon atoms forming the polymer main chain being carbon atoms forming a cyclic group, a part of the polymer main chain is contained in the cyclic group. By the presence of such a cyclic group containing the polymer main chain, crystallization of the polymer (I) will be suppressed, whereby the transparency of the polymer (I) will increase. Further, such a cyclic group suppresses the molecular motion of the polymer main chain, whereby the glass transition temperature will increase.

In the polymer (I), a hydrogen atom may be present. In a case where a hydrogen atom is present in the polymer (I), it is preferably a hydrogen atom bonded to a tertiary carbon atom. Further, in a case where a carbon atom (hereinafter the carbon atom will be referred to as another carbon atom) is bonded to the tertiary carbon atom, it is preferred that no hydrogen atom is bonded to another carbon atom, and it is preferred that a fluorine atom or a perfluorinated organic group is bonded to another carbon atom. In a case where the hydrogen atom which may be present in the polymer (I) is a hydrogen atom bonded to a tertiary carbon atom, the bond between the hydrogen atom and the carbon atom will be strong, whereby withdrawal of hydrogen atoms during exposure can be prevented. Further, by the presence of such a hydrogen atom, hyperconjugation of an unshared electron pair of fluorine atoms will be split, whereby a polymer (I) having high transparency and high light resistance will be formed.

Further, the etheric oxygen atom in the polymer (I) is preferably an oxygen atom bonded to a carbon atom to which no hydrogen atom is bonded, and particularly an etheric oxygen atom present in the main chain is preferably an oxygen atom bonded to a carbon atom to which no hydrogen atom is bonded. For example, the etheric oxygen atom in the unit (1) is preferably an oxygen atom bonded to a carbon atom to which no hydrogen atom is bonded, particularly an etheric oxygen atom forming the main chain is preferably an oxygen atom bonded to a carbon atom to which no hydrogen atom is bonded. Further, the carbon atom to which the etheric oxygen atom is bonded is preferably a carbon atom substituted by a fluorine atom or a monovalent to bivalent fluorinated organic group. This is because when the carbon atom to which the etheric oxygen atom is bonded is substituted by a fluorine atom or a fluorinated organic group, the unshared electron pair of the etheric oxygen atom will be stabilized, whereby the polymer (I) will have excellent light resistance to a short wavelength ultraviolet light.

As examples of the unit (1) which the polymer (I) of the present invention essentially contains, the following units (A), (B), (C) and (D) may be mentioned. The unit (1) is preferably a unit represented by the following formula (A), (C) or (D). In the respective units represented by the following formulae, one to two carbon atoms forming the ring may be substituted by an etheric oxygen atom. Further, at least one hydrogen atom bonded to a carbon atom forming the ring may be substituted by a fluorine atom or a monovalent fluorinated organic group, and two hydrogen atoms bonded to carbon atom(s) forming the ring together may form a bivalent fluorinated organic group.

The monovalent fluorinated organic group is preferably a perfluoroalkyl group or a perfluoroalkyl group containing an etheric oxygen atom, and particularly preferably such a group having from 1 to 6 carbon atoms. The bivalent fluorinated organic group is preferably a perfluoroalkylene group or a perfluoroalkylene group containing an etheric oxygen atom, particularly preferably such a group having from 2 to 6 carbon atoms. Such a monovalent or bivalent group may have a linear structure or a branched structure, and in a case where it has a branched structure, the branched moiety is preferably a perfluoroalkyl group, a perfluoroalkoxy group or a perfluoro(alkoxyalkyl) group, particularly preferably a group having from 1 to 4 carbon atoms:

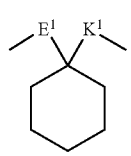

(A)

-continued

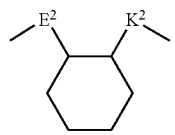
(B)

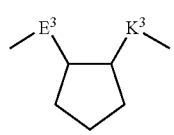
(C)

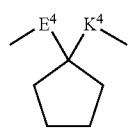
(D)

wherein each of $E^1$, $E^2$, $E^3$ and $E^4$ which are independent of one another, is a single bond or —$CF_2$— and each of $K^1$, $K^2$, $K^3$ and $K^4$ which are independent of one another, is —O— or —$CF_2$O—.

Each of $E^1$ to $E^4$ being a single bond means that the bond extending from the cyclic group is directly bonded to another unit or terminal structure. In a case where the above unit is to be directly obtained by polymerization of a monomer, preferred is a unit wherein each of $E^1$ to $E^4$ is a single bond and each of $K^1$ to $K^4$ is —O—.

As specific examples of the units (A) to (D), the following units may be mentioned, in addition to a unit (A1) as described hereinafter:

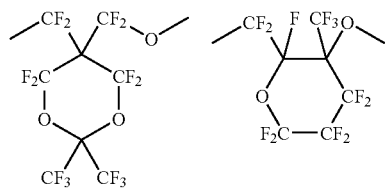

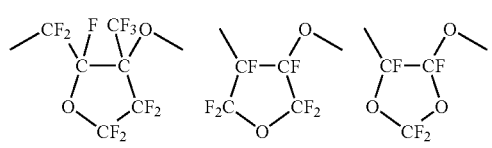

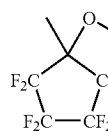

As examples of the unit (1) other than the above, the following unit (E1) and a monomer unit formed by polymerization of the following compound (e2) may, for example, be mentioned. In polymerization of the compound (e2), in addition to polymerization at a keto group moiety, polymerization of a —CF=$CF_2$ group may take place:

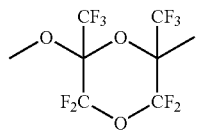
(E1)

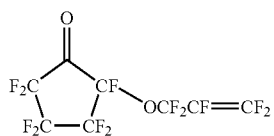
(e2)

The cyclic group which the unit (1) of the present invention essentially contains, is preferably a 5-membered or 6-membered cyclic group, particularly preferably such a cyclic group containing an etheric oxygen atom (—O—), especially preferably such a cyclic group which is saturated. —O— in the cyclic group is present preferably as an oxygen atom forming no polymer main chain. Further, the number of the cyclic group which the unit (1) essentially contains is preferably 1, and the number of the etheric oxygen atom forming the main chain is preferably 1.

Further, the unit (1) in the present invention is preferably at least one unit selected from the following units (A1) to (A3), particularly preferably the following unit (A1). A polymer essentially containing at least one unit selected from the following units (A1) to (A3) is a novel polymer containing an ether bond in its polymer main chain and a saturated cyclic structure:

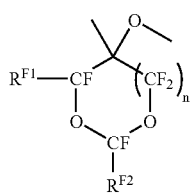
(A1)

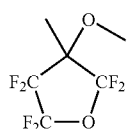
(A2)

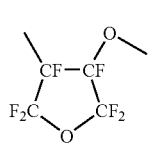
(A3)

In the above formula, n is 1 or 2, preferably 1 from the viewpoint of stability of the cyclic structure. $R^{F1}$ is a fluorine atom or a trifluoromethyl group, preferably a fluorine atom from the viewpoint of availability of the material. $R^{F2}$ is a fluorine atom or a $C_{1-5}$ perfluoroalkyl group. In a case where $R^{F2}$ is a perfluoroalkyl group, it may be linear or branched. $R^{F2}$ is preferably a fluorine atom, a trifluoromethyl group or a pentafluoroethyl group, particularly preferably a fluorine atom.

As specific examples of the unit (A1), units represented by the following formulae may be mentioned:

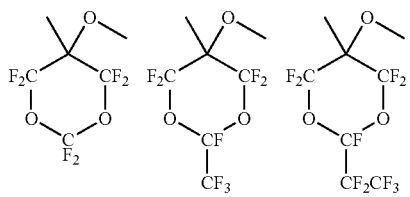

The polymer (I) in the present invention is a polymer essentially containing the unit (1), and it may be a polymer containing only at least one type of the unit (1) or may be a polymer containing, in addition to at least one type of the unit (1), a unit (hereinafter referred to as another unit) other than the unit (1). In a case where the polymer (I) contains two or more types of units, as the arrangement of the units, the polymer (I) may be a block polymer, a graft polymer or a random polymer. From the viewpoint of usefulness of the polymer (I), the units are arranged preferably randomly.

In a case where the polymer (I) is a polymer essentially containing at least one type of the unit selected from the units (A1) to (A3), it is preferably a polymer substantially comprising the unit or a polymer containing at least one type of the unit and at least one type of another unit. The former polymer (I) is preferably a polymer comprising one type of the unit (A1), a polymer comprising the unit (A2) or a polymer comprising the unit (A3). The latter polymer (I) is preferably a polymer containing one type of the unit (A1) and at least one type selected from other units, a polymer containing the unit (A2) and at least one type selected from the other units, or a polymer containing the unit (A3) and at least one type selected from other units.

The proportion of the unit (1) to all the units in the polymer (I) suitably various depending upon the purpose of use of the polymer (I). The proportion of the unit (1) in the polymer is, in a usual case, preferably from 0.0001 to 100 mol %, particularly preferably from 0.01 to 100 mol % with respect to each type. The proportion of another unit is preferably from 0 to 99.9999 mol %, particularly preferably from 0 to 99.99 mol %. In a case where the polymer (I) comprises the unit (A1) to the unit (A3) and another unit, the proportion of the unit (A1) to the unit (A3) is preferably from 1 to 97 mol %, particularly preferably from 5 to 95 mol %, and the proportion of another unit is preferably from 3 to 99 mol %, particularly preferably from 5 to 95 mol %.

The mass average molecular weight of the polymer (I) is preferably from 500 to 1,000,000, particularly preferably from 500 to 500,000, especially preferably from 500 to 300,000. For example, the mass average molecular weights of the polymer (A1), the polymer (A2) and the polymer (A3) are respectively preferably from 500 to 1,000,000.

In a case where the polymer (I) contains another monomer, such another monomer is preferably a monomer essentially containing a fluorine atom, particularly preferably the following units (M1) to (M5). $R^1$ to $R^{10}$ and $Q^2$ are as defined above. Preferred examples of these groups will be described hereinafter:

$$—CHR^1—CR^2R^3— \quad (M1)$$

$$—CFR^4—CR^5R^6— \quad (M2)$$

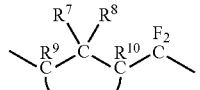

(M3)

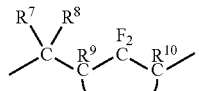

(M4)

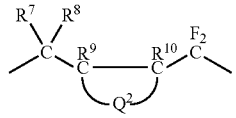

(M5)

As a method for producing the polymer (I) of the present invention, preferred is a method (method 1) by polymerization of a monomer, a method (method 2) comprising a combination of polymerization of a monomer with reaction other than polymerization, or a method (method 3) by reaction other than polymerization, and method 1 or method 2 is preferred. In the case of method 2, a method of obtaining a monomer having a structure capable of being converted by chemical conversion other than polymerization, polymerizing the monomer and subjecting the polymer to the chemical conversion other than polymerization, may be mentioned. Further, in the case of method 3, a method of fluorinating a polymer having a carbon skeleton corresponding to the unit (A1) and hydrogen atoms bonded to carbon atoms of the carbon skeleton to produce a polymer containing the unit (A1) may be mentioned.

In a case where the polymer (I) is a polymer (hereinafter sometimes referred to as polymer (A1)) containing at least one type of the unit (A1), the production method is preferably method 1, particularly preferably a method of polymerizing at least one type of the following compound (a1) (wherein n, $R^{F1}$ and $R^{F2}$ are as defined above). In a case where the polymer (I) is a polymer (hereinafter sometimes referred to as polymer (A2)) containing the unit (A2), the production method is preferably method 1, particularly preferably a method of polymerizing the following compound (a2). In a case where the polymer (I) is a polymer (hereinafter sometimes referred to as polymer (A3)) containing the unit (A3), the production method is preferably method 1, particularly preferably a method of polymerizing the following compound (a3). The method of obtaining the compound (a1) will be described hereinafter:

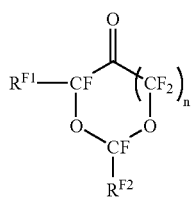

(a1)

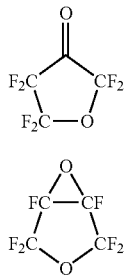

(a2)

(a3)

Further, in a case where each of the polymers (A1) to (A3) contains another unit, the production method is preferably method 1 or method 2. These methods may suitable be changed depending upon the structure of another unit.

As a method for producing the polymer (A1), preferred is a method of polymerizing the compound (a1), a method of polymerizing the compound (a1) with a monomer copolymerizable with the compound (a1) (hereinafter such a monomer will be referred to as comonomer) or a method of polymerizing the compound (a1) with a comonomer and then subjecting the obtained polymer to chemical conversion. The comonomer is a monomer other than the compound (a1), copolymerizable with the compound (a1).

The comonomer may be either a compound containing a fluorine atom or a compound containing no fluorine atom, and is preferably a compound containing a fluorine atom from the viewpoint of usefulness of the polymer (I) and polymerizability with the compound (a1). The same applies to the polymer (A2) and the polymer (A3). As the comonomer which can be used for production of the polymers (A1) to (A3), preferred are the following compounds (m1) to (m3) which are comonomers capable of directly forming the above units (M1) to (M5) by polymerization:

$CHR^1=CR^2R^3$ (m1)

$CFR^4=CR^5R^6$ (m2)

$CR^7R^8=CR^9-Q^2-CR^{10}=CF_2$ (m3)

wherein $R^1$ to $R^{10}$ and $Q^2$ are as defined above.

In a case where each of $R^1$ to $R^{10}$ is a monovalent fluorinated organic group, such a group is a monovalent group containing at least one fluorine atom and at least one carbon atom, and may be either a saturated group or an unsaturated group, and is preferably a saturated monovalent fluorinated organic group. Each of $R^1$ to $R^{10}$ may have a linear structure or a branched structure. The saturated monovalent fluorinated organic group is preferably a polyfluoroalkyl group, particularly preferably a $C_{1-6}$ polyfluoroalkyl group, particularly preferably a $C_{1-6}$ perfluoroalkyl group, especially preferably a trifluoromethyl group or a pentafluoroethyl group.

In a case where each of $R^1$ to $R^{10}$ and $Q^2$ is a bivalent fluorinated organic group, such a group is a bivalent group containing at least one fluorine atom and at least one carbon atom, may be either a saturated group or an unsaturated group, and is preferably a saturated bivalent fluorinated organic group. The saturated bivalent fluorinated organic group is preferably a perfluoroalkylene group containing an etheric oxygen atom, particularly preferably such a group having from 2 to 6 carbon atoms. The bivalent fluorinated organic group may have a linear structure or a branched structure, and in a case where it has a branched structure, the branched moiety is preferably a trifluoromethyl group or a pentafluoroethyl group.

The compound (m1) is a comonomer which forms the unit (M1) by polymerization. The compound (m1) may be a compound having 2 or 3 carbon atoms (such as vinyl fluoride, 1,2-difluoroethylene, vinylidene fluoride or trifluoroethylene), the following compound (m1-1) or compound (m1-2), preferably vinylidene fluoride, vinyl fluoride, trifluoroethylene, the compound (m1-1) or the compound (m1-2). The unit formed by polymerization of the compound (m1-1) may be the following unit (M1-1), and the unit formed by polymerization of the compound (m1-2) may be the following unit (M1-2):

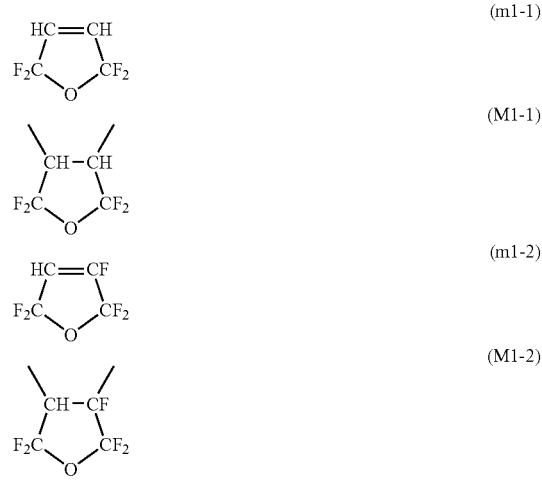

The compound (m2) is a comonomer which forms the unit (M2) by polymerization.

Specifically, the compound (m2) may, for example, be a perfluoroolefin such as tetrafluoroethylene or hexafluoropropylene; a perfluoro(alkyl vinyl ether) such as perfluoro(methyl vinyl ether) or perfluoro(propyl vinyl ether); or a cyclic monomer such as the following compound (m2-1), (m2-2) or (m2-3):

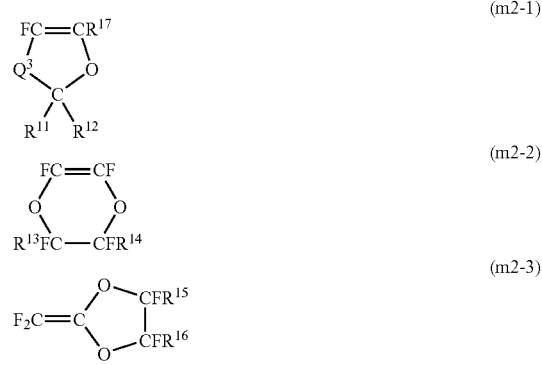

wherein each of $R^{11}$ to $R^{17}$ which are independent of one another, is a fluorine atom or a saturated monovalent fluorinated organic group, provided that $R^{11}$ and $R^{12}$ together may form a bivalent fluorinated organic group ($Q^1$), and $Q^3$ is an etheric oxygen atom or a difluoromethylene group.

In a case where each of $R^{11}$ to $R^{17}$ which are independent of one another, is a saturated monovalent fluorinated organic group, each of them is preferably a fluorine atom or a polyfluoroalkyl group which may contain an etheric oxygen atom, particularly preferably a fluorine atom, a $C_{1-2}$ perfluoroalkyl group or a $C_{1-2}$ perfluoroalkoxy group.

In a case where $R^{11}$ and $R^{12}$ in the formula (m2-1) form a bivalent fluorinated organic group ($Q^1$), $Q^1$ is preferably a fluorinated alkylene group having at least two structures having a hetero atom (preferably an etheric oxygen atom) inserted in the carbon-carbon bond. Such a group may have a linear structure or a branched structure in which the branched moiety is a perfluoroalkyl group.

The compound (m2-1) may be the following compounds, preferably the compound (m2-10), (m2-11), (m2-12) or (m2-13):

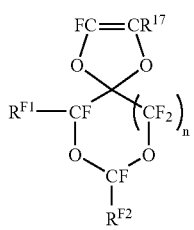
(m2-10)

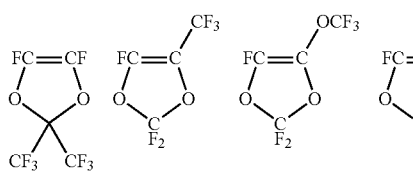
(m2-11)

(m2-12)

(m2-13)

wherein $R^{17}$, n, $R^{F1}$ and $R^{F2}$ are as defined above.

A method of obtaining the compound (m2-10) as one embodiment of the compound (m2-1) will be described hereinafter. Specific examples of the compound represented by the formula (m2-10) include the following compounds:

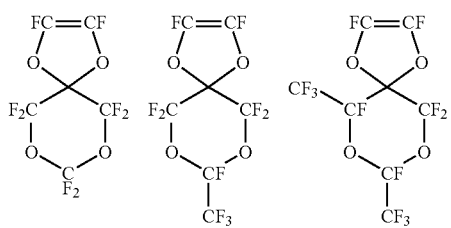

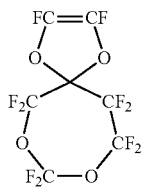

Specific examples of the compound (m2-2) as one embodiment of the compound (m2) include the following compounds:

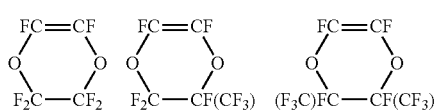

Specific examples of the compound (m2-3) include the following compounds, and preferred is the following compound (m2-30):

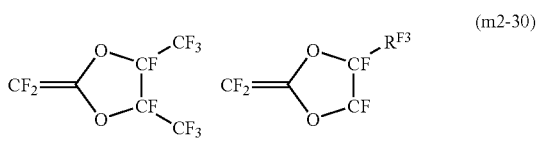
(m2-30)

wherein $R^{F3}$ is a $C_{1-7}$ perfluoroalkyl group, preferably a trifluoromethyl group.

The compound (m2) is preferably tetrafluoroethylene, the compound (m2-1) or the compound (m2-3), particularly preferably tetrafluoroethylene, the compound (m2-10), (m2-11), (m2-12), (m2-13) or (m2-30). Specific examples of a monomer unit derived from the preferred compound (m2) include —$CF_2CF_2$— and the following units (M2-10), (M2-11), (M2-12), (M2-13) and (M2-30):

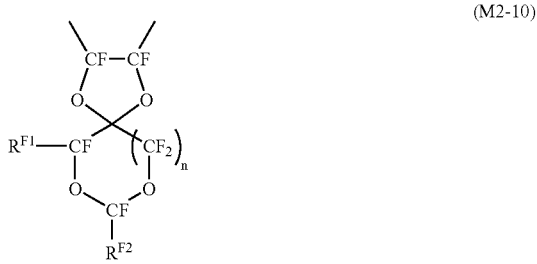
(M2-10)

(M2-11)

(M2-12)

-continued

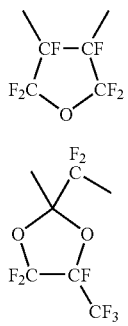
(M2-13)

(M2-30)

The compound (m3) is a comonomer capable of forming the above-described units (M3) to (M5) respectively by polymerization. In the units (M3) to (M5), each of $R^7$ to $R^9$ which are independent of one another, is preferably a hydrogen atom or a fluorine atom. Further, in a case where one or both of $R^7$ and $R^8$ are fluorine atoms, $R^9$ is preferably a hydrogen atom or a fluorine atom, and in a case where $R^7$ and $R^8$ are hydrogen atoms, $R^9$ is preferably a hydrogen atom or a fluorine atom. $R^{10}$ is preferably a fluorine atom, a trifluoromethyl group or a pentafluoroethyl group, particularly preferably a fluorine atom.

$Q^2$ is preferably a perfluoroalkylene group having totally from 1 to 10 carbon atoms, which may contain an etheric oxygen atom. Particularly preferably $Q^2$ is such that among distances between atoms of $Q^2$ connecting a carbon atom to which $R^9$ is bonded and a carbon atom to which $R^{10}$ is bonded, the shortest distance between atoms is from 2 to 4 atoms. Further, $Q^2$ preferably has a linear structure or a branched structure.

Further, $Q^2$ is preferably a $C_{1-3}$ perfluoroaklylene group having an etheric oxygen atom at its terminal which is bonded to a carbon atom to which $R^{10}$ is bonded, a $C_{1-2}$ perfluoroalkylene group having an etheric oxygen atom on each terminal, or a $C_{1-4}$ perfluoroalkylene group. In a case where such a group has a branch, the branched moiety is preferably a $C_{1-3}$ perfluoroalkyl group (preferably a trifluoromethyl group).

Specific examples of the compound (m3) include the following compounds (m3-1), (m3-2) and (m3-3):

$CH_2=CR^{18}-Q^4-O-CF=CF_2$ (m3-1)

$CF_2=CR^{19}-Q^5-O-CF=CF_2$ (m3-2)

$CHF=CR^{20}-Q^6-O-CF=CF_2$ (m3-3)

wherein each of $Q^4$, $Q^5$ and $Q^6$ which are independent of one another, is a $C_{1-3}$ perfluoroalkylene group, and each of $R^{18}$, $R^{19}$ and $R^{20}$ which are independent of one another, is a fluorine atom or a hydrogen atom.

Specific examples of the compound (m3-1) include the following compounds:

$CH_2=CHCF_2CF_2OCF=CF_2$ $CH_2=CHCF_2CF_2CF_2OCF=CF_2$ $CH_2=CHCF_2OCF=CF_2$ $CH_2=CHCF(CF_3)CF_2OCF=CF_2$ $CH_2=CFCF_2CF_2OCF=CF_2$ and $CH_2=CFCF(CF_3)CF_2OCF=CF_2$.

Specific examples of the compound (m3-2) include the following compounds:

$CF_2=CFCF_2OCF=CF_2$ (m3-20)

$CF_2=CFCF_2CF_2OCF=CF_2$ (m3-21)

$CF_2=CHCF(CF_3)CF_2OCF=CF_2$ (m3-22) and $CF_2=CHCF_2CF_2OCF=CF_2$ (m3-23).

Specific examples of the compound (m3-3) include the following compounds:
$CHF=CHCF_2CF_2OCF=CF_2$ and $CHF=CHCF(CF_3)CF_2OCF=CF_2$.

Further, the compound (m3) other than the compounds (m3-1) to (m3-3) may, for example, be $CH_2=CHOC(CF_3)_2OCF=CF_2$.

Among them, the compound (m3) is preferably the compound (m3-1) or (m3-2), particularly preferably the compound (m3-20), (m3-21) or (m3-22). Such a monomer forms a unit essentially containing a cyclic structure by cyclopolymerization. For example, specifically, the monomer unit (M3) derived from the compound (m3) may be a unit formed by cyclopolymerization of the compound (m3). For example, as a unit formed by cyclopolymerization of the compound (m3-22), the following three units may be mentioned:

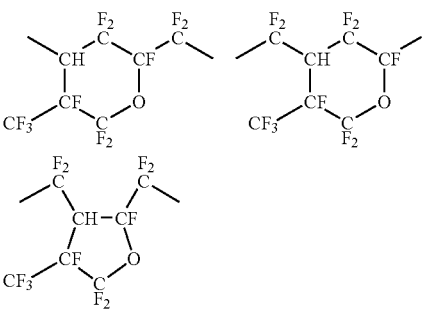

Each of the polymer (A2) and the polymer (A3) can be produced in the same manner as the polymer (A1) by a method of polymerizing the corresponding compound (a2) or compound (a3). Further, in the case of copolymerizing the compound (a2) with another compound, the same monomer as the monomer copolymerizable with the compound (a1) may be used.

The above compound (a1) is obtained preferably by a process represented by the following scheme. In the following scheme, n is 1 or 2, $R^{30}$ is a hydrogen atom, a fluorine atom or a methyl group, and $R^{31}$ is a hydrogen atom, a fluorine atom or a $C_{1-5}$ alkyl group:

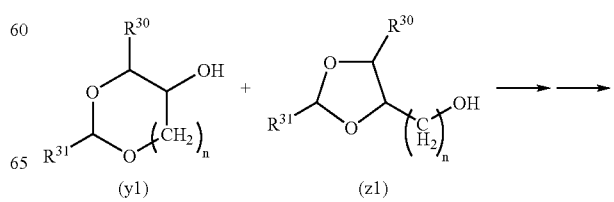

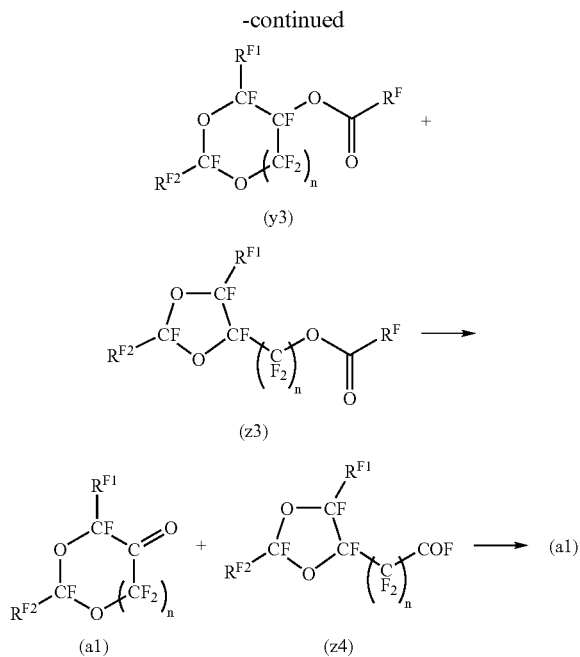

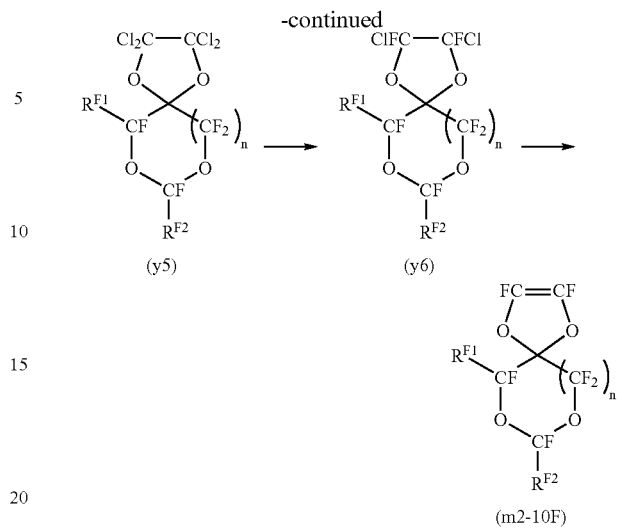

That is, an addition product (usually comprising the above compounds (y1) and (z1)) of $R^{30}CH(OH)CH(OH)(CH_2)_nOH$ with $R^{31}CHO$, and a compound represented by $R^F$—COF (wherein $R^F$ is a perfluoroalkyl group which may have an etheric oxygen atom, preferably a perfluoroalkyl group having an etheric oxygen atom), are subjected to esterification, followed by fluorination in a liquid phase to obtain a mixture of the above compounds (y3) and (z3). Then, decomposition of the ester bond is carried out in the mixture to obtain a mixture of the above compounds (a1) and (z4), and the compound (a1) is separated from the mixture.

As a method of separating the compound (a1) from the mixture of the compounds (a1) and (z4), preferred is a method of adding water to the mixture so that the keto group in the compound (a1) is converted to a —C(OH)$_2$-group and the —COF group in the compound (z4) is converted to a —COOH group, reconverting the —C(OH)$_2$-group to a keto group by dehydration, and then separating the compound (a1) e.g. by distillation.

Further, as a method of obtaining the following compound (m2-10F) which is a compound (m2-10) wherein $R^{17}$ is a fluorine atom, the following production route employing the compound (a1) obtained by the above process may be mentioned (wherein n, $R^{F1}$ and $R^{F2}$ are as defined above):

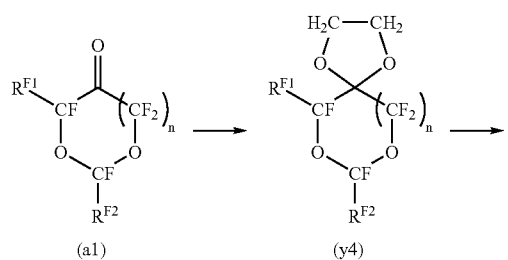

Namely, the above compound (y4) is obtained by a method of adding ethylene oxide to the compound (a1), or a method of adding 2-chloroethanol, followed by dehydrochlorination in the presence of a base for ring closure. Then, the compound (y4) is subjected to photochlorination to obtain the above compound (y5). Then, the compound (y5) is selectively subjected to fluorination to obtain the above compound (y6), which is dechlorinated to obtain the compound (m2-10F). Further, a compound (m2-10) wherein $R^{17}$ is a saturated monovalent fluorinated organic group can be obtained in the same manner except that ethylene oxide to be added to the compound (a1) is changed to another compound.

As a method of obtaining the compound (a2), preferred is a process of subjecting 3-hydroxytetrahydrofuran and $R^FCOF$ (wherein $R^F$ is a perfluoroalkyl group which may contain an etheric oxygen atom) are subjected to esterification, followed by fluorination e.g. by liquid phase fluorination, and then carrying out decomposition of the ester bond. As a method of obtaining the compound (a3), preferred is a method of oxidizing the following compound (m2-13):

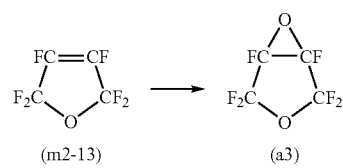

The polymer (I) in the present invention is preferably the polymers (A1) to (A3), particularly preferably the polymer (A1). Each of such polymers (A1) to (A3) is preferably a homopolymer comprising only one type of a compound selected from the compounds (a1) to (a3) or a copolymer of the above one type of the compound with a comonomer. It is especially preferably a homopolymer comprising only one type of the compound (a1) or a copolymer of the compound (a1) with a comonomer.

In the case of a copolymer, it is preferably a copolymer formed by copolymerization of the compound (a1) with vinylidene fluoride, the compound (a1) with vinyl fluoride, the compound (a1) with trifluoroethylene, the compound (a1) with the compound (m1-1), the compound (a1) with tetrafluoroethylene, the compound (a1) with the compound (m2-10), the compound (a1) with the compound (m2-11), the compound (a1) with the compound (m2-12), the compound (a1) with the compound (m2-13), or the compound (a1) with the compound (m2-30). Further, a copolymer comprising a unit of the compound (a1) and a unit formed by cyclopolymerization of the compound (m3-20), a copolymer comprising a unit of the compound (a1) and a unit formed by cyclopolymerization of the compound (m3-21), a copolymer comprising a unit of the compound (a1) and a unit formed by cyclopolymerization of the compound (m3-22), or a copolymer comprising a unit of the compound (a1) and a unit formed by cyclopolymerization of the compound (m3-23), may also be mentioned.

The method of obtaining the polymer (A1) by polymerization of the compound (a1) and the method of obtaining the polymer (A2) by polymerization of the compound (a2) in the present invention are based on a novel finding. Namely, radical copolymerization of vinylidene fluoride with $CF_3COCF_3$ which is a fluorinated noncyclic ketone compound has been reported, but the present inventors have found polymerization of the ketone group in a fluorinated cyclic ketone compound such as the compound (a1) for the first time.

A method for producing the polymer (I) other than the polymer (A1) by the above method 1 may be a method of obtaining a polymer containing the following unit (C1) by cyclopolymerization of a compound represented by the formula $CF_2=CFO(CF_2)_2COCF_3$, or a method for producing a polymer containing a unit (A3) by polymerization of the compound (a3). The method of obtaining a polymer by polymerization of the compound (a3) is novel:

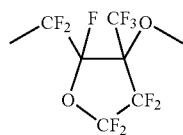

(C1)

A method for producing the polymer (I) by the above method 2 may, for example, be a process of obtaining a polymer containing the following unit (y7), which is esterified to obtain a polymer containing the following unit (y8), fluorinating the polymer by means of e.g. liquid phase fluorination to obtain a polymer containing the following unit (y9), and subjecting the polymer to e.g. fluorination as described hereinafter to obtain a polymer containing the unit (A4). In the following scheme, $R^F$ is as defined above:

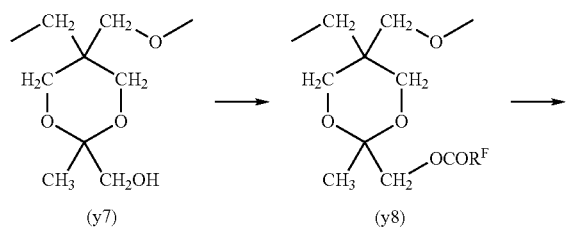

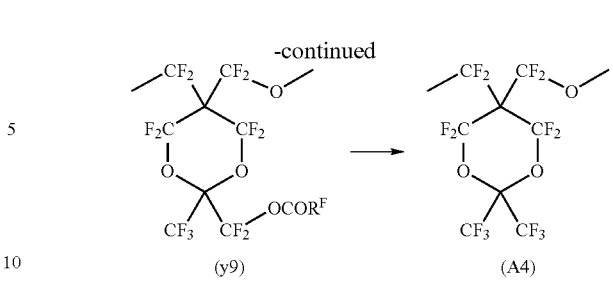

The polymerization in method 1 or 2 may be carried out by ionic polymerization such as anionic polymerization or cationic polymerization, or radical polymerization, preferably by radical polymerization. As the polymerization method, bulk polymerization, suspension polymerization or solution polymerization may, for example, be mentioned. Polymerization of the compound (a3) is carried out preferably by anionic polymerization.

The radical polymerization is carried out preferably with a polymerization initiator. The polymerization initiator is preferably a perfluorinated compound with a view to avoiding formation of a —$CH_2$— chain derived from the polymerization initiator e.g. at the terminal group of the polymer, and it is particularly preferably a perfluorinated compound wherein the perfluoroalkyl group moiety has a small number of carbon atoms (preferably 1 to 3 carbon atoms), or a perfluorinated compound having a polyether structure.

As the polymerization initiator, the following compounds may be mentioned. In the following formulae, a perfluoroalkyl group moiety having 3 or more carbon atoms may have a linear structure or a branched structure:

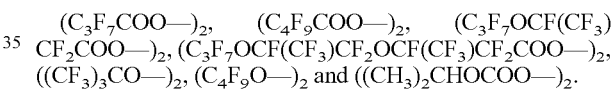

The polymerization is carried out preferably in the presence of a solvent with a view to suppressing abnormal polymerization or decomposition of a monomer such as the compound (a1) due to sudden heat generation. With respect to a non-fluoromonomer such as the compound (a1), from a viewpoint of high reactivity of the monomer with a protic solvent, the polymerization is carried out particularly preferably in the presence of an aprotic organic solvent. The aprotic organic solvent is preferably an aprotic organic solvent containing no chlorine atom, since chlorine atoms in the solvent remaining in the polymer (I) will impair durability of the polymer (I) to a short wavelength light.

The aprotic organic solvent may, for example, be a polyfluoroalkane such as perfluorooctane, perfluorodecane, 2H,3H-perfluoropentane or 1H-perfluorohexane; or a polyfluoroether such as methyl perfluoroisopropyl ether, methyl perfluorobutyl ether, methyl (perfluorohexylmethyl)ether, methyl perfluorooctyl ether or ethyl perfluorobutyl ether.

The reaction temperature in the polymerization is preferably from −10° C. to +150° C., particularly preferably from 0° C. to +120° C. Particularly when two or more types of monomers are reacted, the arrangement of the monomer units tends to be in a block form if the reaction temperature is too high. On the other hand, if the reaction temperature is too low, the yield of the polymer tends to be extremely low.

The reaction pressure for the polymerization may be any of reduced pressure, elevated pressure and atmospheric pressure, and usually, preferably from atmospheric pressure to 2 MPa (gauge pressure), particularly preferably from atmospheric pressure to 1 MPa (gauge pressure).

To the polymer (I) of the present invention, a functional group may be introduced. The functional group may, for example, be a carboxyl group, a sulfonic group, an alkoxycarbonyl group, an acyloxy group, an alkenyl group, a hydrolyzable silyl group, a hydroxyl group, a maleimide group, an amino group, a cyano group or an isocyanate group. In a case where the polymer (I) is used for e.g. an adhesive for a pellicle, it is preferred to introduce a functional group into the polymer (I). The proportion of the functional group in the polymer (I) is preferably from 0.0001 to 0.0010 mol/g.

As a method of introducing a functional group to the polymer (I), a method of polymerizing a comonomer having a functional group (by the above method 1) or a method of carrying out polymerization using a comonomer having a group to which a functional group can be introduced and then introducing a functional group after the polymerization (by the above method 2) may be mentioned. These methods may be carried out by known methods (for example, JP-A-4-189880, JP-A-4-226177, JP-A-6-220232).

As a method of introducing a functional group to the polymer (I), preferred are the following methods 4 to 7.

(Method 4) a method of copolymerizing the compound (a1) with a comonomer having a functional group.

(Method 5) a method of converting a functional group derived from a polymerization initiator and/or a chain transfer agent or a functional group which can be introduced from said functional group, into an aimed functional group.

(Method 6) a method of copolymerizing the compound (a1) with a comonomer having a group to be converted to a functional group, and chemically converting the group to be converted to a functional group.

(Method 7) a method of subjecting a polymer to high temperature treatment in an oxygen gas atmosphere so that side chains and/or terminal groups are partially oxidatively decomposed and converted into carboxyl groups.

Among them, method 5 or 7 is particularly preferred in view of easy reaction operation. In the above method, the group which can be converted to a functional group may be an alkoxycarbonyl group. This group can be converted to a carboxyl group e.g. by hydrolysis.

In a case where the polymer (I) is produced by polymerization, it is preferred to bring a fluorine gas into contact with the polymer so as to convert the terminal group of the polymer chain. The treatment temperature is preferably at most 250° C., particularly preferably at most 240° C., especially preferably at most 50° C. This treatment may be carried out on the polymer (I) in a solid state or on the polymer (I) in a solution state. By this treatment, the polymer (I) becomes a polymer more excellent in durability, having undesirable terminal moieties and unsaturated bond moieties of the polymer chain which may be formed by the polymerization, substituted and/or added by fluorine atoms. For example, in a case where the terminal group of the polymer (I) contains a —CH=CH$_2$ group, the terminal group can be converted to a —CF$_2$CF$_3$ group and/or a —CF$_2$CF$_2$H group by the treatment. However, in a case where a functional group is to be introduced to the polymer (I), it is preferred not to carry out the treatment by a fluorine gas.

The polymer (I) of the present invention is a novel compound. The polymer (I) may be oily or liquid depending upon the molecular weight, the structure or use conditions. Such a polymer can also be used as an oil when an exposure treatment by an immersion exposure method (immersion method) is carried out. For example, when the polymer (I) is used for an immersion exposure method, the polymer (I) is supplied between a projection lens and a wafer coated with a resist. Further, it can also be used for an exposure treatment employing a ultraviolet light having a wavelength of at most 200 nm. The molecular weight of the polymer (I) which can be used for an immersion exposure method may suitably be changed by the structure of another unit, but a polymer having a molecular weight of at most 7,000 is preferred, and a polymer having a molecular weight of from 500 to 7,000 is particularly preferred.

The polymer (I) of the present invention is usually used as a solid, or a solution having a solid polymer dissolved. In a case where the polymer (I) of the present invention is a solid, since the saturated cyclic structure based on the unit (A1) is bulky, movement of the polymer main chain is restricted, whereby the polymer has a high glass transition temperature. Further, the polymer (I) of the present invention has high durability and transparency to total light beams, particularly a short wavelength light. Further, the polymer (I) of the present invention is excellent in low refractivity, low dielectric properties, low water absorptivity, low surface energy properties, heat resistance and chemical resistance. Therefore, the polymer (I) can be useful as a functional material in fields in which such properties are required.

Examples of applications of a coating film to be formed from the polymer (I) include a pellicle membrane as described hereinafter, and a surface protective film for e.g. a spectacle lens, an optical lens, an optical cell, a DVD disk, a photodiode, a show window, a showcase, a solar cell and a display (such as PDP, LCD, FED, organic EL or projection TV), a protective film for a semiconductor device (such as an interlayer insulation film, a buffer coating film, a passivation film or an α-ray barrier film), a device sealing material, an interlayer insulation film for a high-density mounting board and a moistureproof film for a high frequency device (such as a moistureproof film for e.g. a RF circuit device, a GaAs device or a InP device).

Examples of applications of a molded product made from the polymer (I) include a core material and a cladding material of optical fibers, and a core material and a cladding material of an optical waveguide.

Further, the polymer (I) is useful also as a film, or as a film comprising a combination of the polymer (I) with another material (such as a laminate film with a thermoplastic resin such as a polyimide). Further, the polymer (I) is useful also as a water and oil repellent, an adhesive for a semiconductor (such as an adhesive for LOC or die bonding) or an optical adhesive.

When the polymer (I) is used for the above applications, it may also be used as a solution composition having the polymer (I) dissolved in an organic solvent. The organic solvent is preferably at least one type of a fluorinated solvent. In the case of a solution composition, the amount of the polymer (I) in the composition is preferably from 0.1 to 25 mass % based on the organic solvent from the viewpoint of miscibility with the organic solvent, particularly preferably from 5 to 15 mass % from the view point of the thickness of the coating film or film in the above applications and stability of the solution composition.

The organic solvent to be used for formation of the solution composition is not particularly limited, and is preferably a fluorinated organic solvent in which the polymer (I) is highly soluble. The following compounds may be mentioned as examples of the fluorinated organic solvent. Polyfluoroaromatic compounds such as perfluorobenzene, pentafluorobenzene and 1,3-bis(trifluoromethyl)benzene. Polyfluoro(trialkylamine) compounds such as perfluoro(tributylamine) and perfluoro(tripropylamine). Polyfluorocycloalkane compounds such as perfluorodecalin and perfluorocyclohexane. Polyfluorocyclic ether compounds such as perfluoro(2-butyltetrahydrofuran).

Polyfluoroalkanes such as perfluorooctane, perfluorodecane, 2H,3H-perfluoropentane and 1H-perfluorohexane. Polyfluoroethers such as methyl perfluoroisopropyl ether, methyl perfluorobutyl ether, methyl(perfluorohexylmethyl) ether, methyl perfluorooctyl ether and ethyl perfluorobutyl ether.

The solution composition of the present invention is useful also as a surface treating agent which imparts properties of the polymer (I) to the surface of a substrate. In a case where the solution composition is used as a surface treating agent, preferred as a treatment method is a method of applying the solution composition to a substrate and drying it.

As a method of applying the solution composition to a substrate, a known method may be employed, such as roll coating, casting, dip coating, spin coating, water casting, die coating or Langmuir Brodgett. Among these methods, spin coating is preferred since strict film thickness control is required for a pellicle membrane. The substrate is preferably a substrate (such as a silicon wafer or quartz) having a flat surface.

The polymer (I) of the present invention, particularly the polymer (A1), is particularly useful as a material for a pellicle. The material for a pellicle may be, for a pellicle for an exposure treatment comprising a pellicle membrane bonded to a frame by means of an adhesive, the pellicle membrane and/or the adhesive. Namely, the present invention provides a pellicle for an exposure treatment comprising a pellicle membrane bonded to a frame by means of an adhesive, wherein the pellicle membrane and/or the adhesive essentially comprises the polymer (I).

A pellicle employing the polymer (I) for a pellicle membrane, is a pellicle comprising a pellicle membrane essentially comprising the polymer (I) and a frame. A pellicle having the polymer (I) applied to an adhesive is a pellicle comprising a pellicle membrane bonded to a frame by means of an adhesive essentially comprising the polymer (I). In a case where the polymer (I) is employed for the pellicle membrane, it is preferred to use a polymer (I) having no functional group in view of durability and transparency to a short wavelength light.

In a case where the polymer (I) is employed for the adhesive, it is preferred to employ a polymer (I) having a functional group in view of adhesive properties. The functional group is preferably a carboxyl group having favorable adhesive properties at low temperature and having storage stability.

In a case where the polymer (I) is employed for the adhesive, the polymer (I) is used preferably as a composition comprising a polymer (I) having a functional group and the above fluorinate organic solvent. Further, in order to improve adhesive properties, e.g. a silane, epoxy, titanium or aluminum coupling agent may be incorporated in the composition. In a case where a polymer (I) having no functional group is used as the adhesive, the pellicle membrane and the frame can be strongly bonded by incorporating the above coupling agent.

As a material to form the frame, a metal material is preferred in view of strength, a material having durability to a short wavelength light to be used for an exposure treatment is particularly preferred. Such a material may, for example, be aluminum, 18-8 stainless steel, nickel, synthetic quartz, calcium fluoride or barium fluoride. The material is preferably aluminum or synthetic quartz from the viewpoint of environmental resistance, strength and specific gravity.

As a method for producing a pellicle having a pellicle membrane comprising the polymer (I), a known process may be employed. For example, the polymer (I) is dissolved in an organic solvent to prepare a solution composition, which is applied to a substrate. The substrate is dried so that the solvent is volatilized to obtain a treated substrate having a thin membrane of the polymer (I) formed thereon. Separately, an adhesive is applied to a frame, which is heated (preferably at from 100 to 200° C.). Then, the treated substrate is bonded to the surface on which the adhesive is applied of the frame, and the substrate is separated from the treated substrate to obtain a pellicle. The thickness of the pellicle membrane is usually preferably from 0.01 to 50 μm.

For the pellicle of the present invention, it is preferred to employ the polymer (I) for both the pellicle membrane and the adhesive, but a material other than the polymer (I) may be used for one of them. As a pellicle membrane comprising a material other than the polymer (I) and an adhesive comprising a material other than the polymer (I), materials as disclosed in JP-A-2001-330943 and WO2001/37044 may be mentioned. For example, as the adhesive, a polymer selected from a propylene/vinylidene fluoride/tetrafluoroethylene copolymer, a vinylidene fluoride/hexafluoropropylene copolymer and a copolymer containing vinylidene fluoride as the main component, or a polymer having a functional group introduced to the above polymer by the above method, may be mentioned.

The pellicle of the present invention can be used as a pellicle for an exposure treatment employing various irradiation wavelengths as a light source. Particularly, it is preferred as a pellicle for an exposure treatment employing a short wavelength light, particularly preferred as a pellicle for an exposure treatment employing a F2 excimer laser light. The present invention further provides an exposure treatment method of carrying out an exposure treatment employing the pellicle.

The polymer (I) of the present invention is highly transparent to a short wavelength light. The reason is not necessarily clearly understood but is considered to be because the polymer (I) contains an oxygen atom based on an ether bond and a cyclic group structure containing the oxygen atom in its main chain, so that the main chain would not have long electrical conjugation. Further, the polymer (I) of the present invention is highly durable to a short wavelength light. The reason is not necessarily clearly understood but is considered to be because the polymer (I) is a polymer containing an oxygen atom based on an ether bond in its main chain, so that the electrical conjugation in the main chain is split, and because the polymer (I) is a polymer having the above cyclic group structure with small distortion in its main chain so that the main chain is less likely to undergo cleavage.

EXAMPLES

Now, the present invention will be explained in detail below, but the present invention is by no means restricted thereto. In the following, the mass average molecular weight is represented by $M_w$, the number average molecular weight by $M_n$, the glass transition point by $T_g$, gel permeation chromatography by GPC, gas chromatography by GC, $CCl_2FCClF_2$ by R-113, and dicyclopentafluoropropane by R-225. Further, the pressure is represented by absolute pressure unless otherwise specified.

Method of Measuring Molecular Weight $M_w$ and $M_n$ were measured by GPC. The measurement method was in accordance with a method disclosed in JP-A-

2000-74892. Specifically, as a mobile phase, a mixed liquid (volume ratio 99:1) of $CF_2ClCF_2CFHCl$ and $(CF_3)_2CHOH$ was used, and as an analytical column, two columns PLgel 5 μm MIXED-C (inner diameter 7.5 mm, length 30 cm) manufactured by Polymer Laboratories Ltd. connected in series were used. As a standard sample for molecular weight measurement, ten types of polymethyl methacrylates (manufactured by Polymer Laboratories Ltd.) having molecular weights of from 1,000 to 2,000,000, each having a molecular weight distribution ($M_w/M_n$) less than 1.17, were used. The mobile phase flow rate was 1.0 ml/min, and the column temperature was 37° C. An evaporative light scattering detector was used as a detector. $M_w$ and $M_n$ were represented by molecular weights calculated by polymethyl methacrylate. The intrinsic viscosity was measured by using a pouring type viscosity tube. Further, $T_g$ was measured by means of differential scanning calorimetery.

Monomer Production Examples (Examples 1 to 5)

Example 1

Production Example for Compound (a1-1)

In the following formulae, $R^{F2}$ is $—CF(CF_3)OCF_2CF(CF_3)O(CF_2)_2CF_3$:

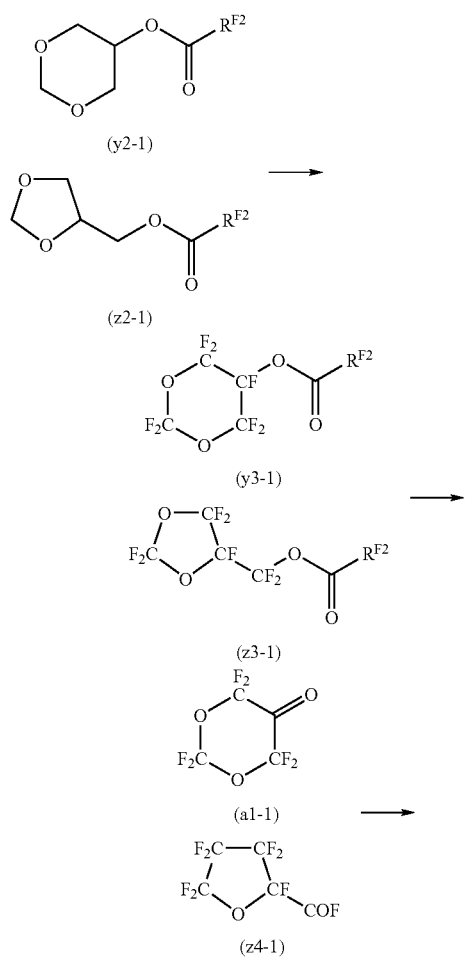

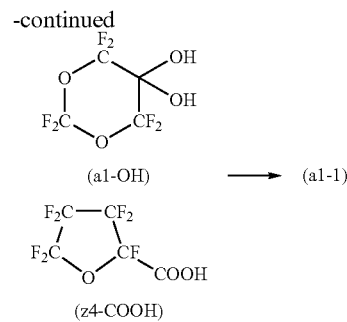

Example 1-1

Preparation Example for a Mixture of Compound (y2-1) and Compound (z2-1)

$F(CF_2)_3OCF(CF_3)CF_2OCF(CF_3)COF$ (2,515 g) and a NaF powder (240 g) were put into an autoclave (internal capacity 2 L, made of hastelloy C). The autoclave was cooled with sufficiently stirring, and glycerol formal (401 g) was slowly introduced while the internal temperature of the autoclave was kept at 30° C. or below under atmospheric pressure. HF formed by the reaction was removed by adsorption by NaF. After the whole amount of glycerol formal was introduced, stirring was carried out further for 24 hours, and the NaF powder was removed by filtration under pressure to obtain a product. The product was analyzed by means of NMR and GC and as a result, formation of compounds (y2-1) and (z2-1) as a mixture with a purity of 99.4% was confirmed. No unreacted glycerol formal was detected. The obtained mixture was used for the subsequent reaction as it was.

$^1$H-NMR of the compound (y2-1) (300.4 MHz, solvent: $CDCl_3$, standard: TMS) δ (ppm): 3.93 to 4.10 (4H), 4.82 (1H), 4.95 (2H).

$^{19}$F-NMR of the compound (y2-1) (282.7 MHz, solvent: $CDCl_3$, standard: $CFCl_3$) δ (ppm): −79.0 to −80.7 (4F), −81.9 to −83.1 (8F), −84.6 to −85.6 (1F), −130.1 (2F), −132.0 (1F), −145.7 (1F).

$^1$H-NMR of the compound (z2-1) (300.4 MHz, solvent: $CDCl_3$, standard: TMS) δ (ppm): 3.74 (1H), 3.93 to 4.10 (1H), 4.27 to 4.54 (3H), 4.90 (1H), 5.04 (1H).

$^{19}$F-NMR of the compound (z2-1) (282.7 MHz, solvent: $CDCl_3$, standard: $CFCl_3$) δ (ppm): −79.0 to −80.7 (4F), −81.9 to −83.1 (8F), −84.6 to −85.6 (1F), −130.1 (2F), −132.0 (1F), −145.7 (1F).

Example 1-2

Preparation Example for Mixture of Compound (y3-1) and Compound (z3-1)

Into an autoclave (internal capacity 3 L, made of stainless steel) equipped with a condenser, a pump and a circulation line connected to the pump, $F(CF_2)_3OCF(CF_3)CF_2OCF(CF_3)COF$ (4 kg) was added, and the liquid in the system was circulated (flow rate 300 L/h) as a circulating liquid by the pump. A heat exchanger was installed at a part of the circulation line from the discharge side of the pump over the top of the autoclave, so that the temperature of the circulating liquid was kept at 25° C. An injector (made of stainless steel) was installed in the middle of the circulation line, so that a gas can be aspirated into the circulating liquid. Further, between the injector and the pump, a material supply tube and a draw tube were provided, so that the mixture obtained in Example 1-1 as a material and the reaction crude liquid to be formed by the reaction could be put in or drawn from the autoclave as needed.

A nitrogen gas was blown to the autoclave through the injector for 2.0 hours, and a fluorine gas (hereinafter referred to as 50% diluted gas) diluted to 50% with a nitrogen gas was blown at a flow rate of 113.2 L/h for 1.5 hours. Then, while the 50% diluted fluorine gas was blown at the same flow rate, the mixture obtained in Example 1-1 without dilution was continuously supplied (average supply amount about 50 g/h) to the circulating liquid from the material supply tube, and totally 4,800 g of the material was charged.

Further, every 8 hours after initiation of the material supply, about 270 g of the reaction crude liquid was drawn from the draw tube 12 times in total. After completion of supply of the mixture obtained in Example 1-1, the 50% diluted fluorine gas was supplied for one hour, and a nitrogen gas was further blown for 3.5 hours. Then, the entire liquid in the autoclave was drawn, and totally 7,261 g of the reaction crude liquid, including the reaction crude liquid drawn during the reaction, was recovered.

The reaction crude liquid was analyzed by $^{19}$F-NMR and as a result, it was confirmed that the yield of the compound (y3-1) from the compound (y2-1) was 57.5%, the yield of the compound (z3-1) from the compound (z2-1) was 81%, and the rest contained as the main component $F(CF_2)_3OCF(CF_3)$ $CF_2OCF(CF_3)COF$ in the circulating liquid. The obtained reaction crude liquid was used for the subsequent reaction as it was.

$^{19}$F-NMR of the compound (y3-1) (282.7 MHz, solvent: CDCl$_3$, standard: CFCl$_3$) δ (ppm): −52.8 (2F), −78.5 to −80.5 (4F), −81.9 (8F), −83.0 to −89.1 (5F), −130.1 (2F), −132.0 (1F), −139.8 (1H), −145.5 (1F).

$^{19}$F-NMR of the compound (z3-1) (282.7 MHz, solvent: CDCl$_3$, standard: CFCl$_3$) δ (ppm): −54.5 to −58.3 (2F), −78.5 to −80.5 (4F), −81.9 (8F), −83.0 to −89.1 (5F), −127.9 (1F), −130.1 (2F), −132.0 (1F), −145.5 (1F).

Example 1-3

Preparation Example for Compound (a1-1)

The reaction crude liquid (3,575.6 g) obtained in Example 1-2 was charged into a round bottom flask (internal capacity 2 L) together with a KF powder (15.7 g). At the upper portion of the round bottom flask, a condenser having its temperature controlled at 20° C. and a round bottom flask cooled at −78° C. were connected in series. Then, while the round bottom flask into which the reaction crude liquid was charged was vigorously stirred, it was heated in an oil bath at 90° C. for 5 hours, and the obtained fraction was recovered in the round bottom flask cooled at −78° C. After formation of a gas in the round bottom flask into which the reaction crude liquid was charged was no more observed, the temperature of the oil bath was increased to 100° C., followed by stirring with heating further for about one hour, and heat decomposition was completed. The obtained fraction was used for the subsequent reaction as it was.

The fraction (463.2 g) was analyzed by $^{19}$F-NMR and as a result, it was confirmed to be a mixture of the compound (a1-1) and the compound (z4-1).

$^{19}$F-NMR of the compound (a1-1) (282.7 MHz, solvent: CDCl$_3$, standard: CFCl$_3$) δ (ppm): −51.9 (2F), −80.6 (4F).

$^{19}$F-NMR of the compound (z4-1) (282.7 MHz, solvent: CDCl$_3$, standard: CFCl$_3$) δ (ppm): 25.5 (1F), −53.6 (1F), −58.4 (1F), −77.5 (1F), −88.5 (1F), −119.2 (1F).

Then, while the internal temperature of the round bottom flask in which the fraction was put was kept at 10° C. or below, deionized water (95.5 g) was slowly dropwise added. After the entire deionized water was dropwise added, the internal temperature was increased to 25° C., and stirring was continued for 15 hours to obtain a reaction liquid. The reaction liquid was analyzed by $^{19}$F-NMR and as a result, it was confirmed to be a mixture of a compound (a1-OH) having the compound (a1-1) hydrated and a compound (z4-COOH) having the compound (z4-1) converted to carboxylic acid. Further, the yield determined by $^{19}$F-NMR (internal standard: C$_6$F$_6$) was 91% with respect to the compound (a1-OH) based on the compound (a1-1), and 75% with respect to the compound (z4-COOH) based on the compound (z4-1). The obtained reaction liquid was used for the subsequent reaction as it was.

$^{19}$F-NMR of the compound (a1-OH) (282.7 MHz, solvent: CDCl$_3$, standard: CFCl$_3$) δ (ppm): −52.2 (2F), −87.9 (4F).

$^{19}$F-NMR of the compound (z4-COOH) (282.7 MHz, solvent: CDCl$_3$, standard: CFCl$_3$) δ (ppm): −54.0 (1F), −59.2 (1F), −79.1 (1F), −90.2 (1F), −119.5 (1F).

Then, concentrated sulfuric acid (203.2 g) was charged to a round bottom flask (internal capacity 500 mL) and heated in an oil bath at 130° C. with vigorous stirring. At the upper portion of the round bottom flask, a condenser having its temperature controlled at 20° C. and a round bottom flask cooled at −78° C. were connected in series. Then, the reaction liquid (304.4 g) was slowly dropwise added, and the obtained product was recovered in the round bottom flask cooled at −78° C. The entire reaction liquid was dropwise added, followed by stirring with heating at 145° C. for about one hour, and the reaction was completed to obtain a product. The product was analyzed by $^{19}$F-NMR and as a result, it was confirmed that the compound (a1-1) was substantially quantitatively formed.

Example 2

Production Example for Compound (m2-10F)

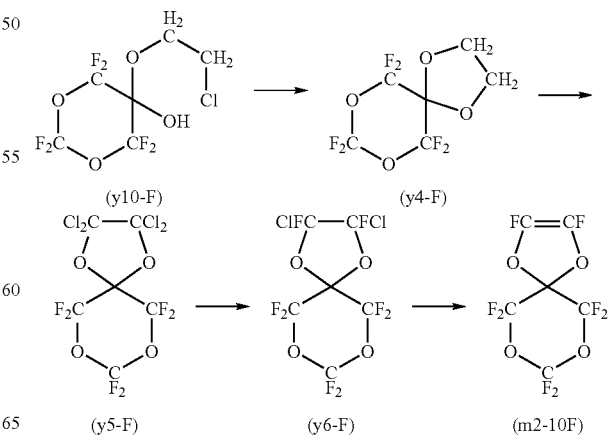

Example 2-1

Preparation Example for Compound (y10-F)

While the round bottom flask having the product obtained in Example 1-3 in it was cooled at −78° C. with stirring, HOCH$_2$CH$_2$Cl (40.5 g) was slowly dropwise added. After the entire HOCH$_2$CH$_2$Cl was dropwise added, the flask was heated to 25° C. with stirring, and stirring was continued further for 16 hours to obtain a reaction liquid. Then, the reaction liquid was simply distilled off to obtain a colorless and transparent liquid (106.8 g). The liquid was analyzed by NMR and formation of the compound (y10-F) as confirmed.

The interior of a four-necked flask (internal capacity 500 mL, made of glass) equipped with a reflux condenser, a stirrer and a dropping funnel was sufficiently flushed with a nitrogen gas, and while the flask was cooled in water bath, methanol (160.0 g) and sodium hydroxide (17.6 g) were charged and stirred for complete dissolution.

Then, while the internal temperature of the flask was kept at 10° C. or below and stirring was continued, the compound (y10-F) (99.8 g) was dropwise added from the dropping funnel. Stirring was continued for 12 hours as it was to complete the reaction, and the liquid in the flask was added to deionized water (400 mL) to obtain an aqueous solution. The aqueous solution was extracted with R-225 (40 g) to obtain an extract. The extract was concentrated by a rotary evaporator, and R-225 was distilled off under reduced pressure and as a result, a colorless and transparent liquid (82.0 g) was obtained. Formation of the compound (y4-F) in the liquid was confirmed by NMR.

Example 2-2

Preparation Example for Compound (y5-F)

The interior of a flask (internal capacity 2 L) equipped with a high-pressure mercury-vapor lamp at a center portion and a dry ice condenser, a chlorine gas inlet and a thermocouple thermometer at a side tube was flushed with a nitrogen gas, and the colorless and transparent liquid (76 g) obtained in Example 2-1 and R-113 (540 g) were charged in the flask. The mercury-vapor lamp was turned on while the internal temperature of the flask was kept at 10° C. Then, the internal temperature of the flask was increased to 30° C., and introduction of a chlorine gas into the flask was slowly started. Then, the flask was heated and kept constant at from 45 to 50° C. The unreacted chlorine gas was refluxed to the flask by the dry ice condenser to carry out the reaction. The reaction was considered to be completed when fluorine was no more consumed, and the total amount of chlorine charged to the flask was 90.5 g.

Then, chlorine remaining in the flask was removed by a nitrogen gas and the content in the flask was recovered. The content was concentrated by an evaporator to obtain a colorless and transparent liquid (120 g). Formation of the compound (y5-F) in the liquid was confirmed by NMR. Further, the compound (y5-F) as a fraction (116 g) at 2 kappa/(40 to 41° C.) was obtained by distillation under reduced pressure.

Example 2-3

Preparation Example for Compound (y6-F)

Into a dry four-necked flask equipped with a reflux condenser, a stirrer, a dropping funnel and a thermocouple thermometer, antimony trifluoride (61.6 g) was charged, followed by vacuum drying for about 12 hours by a vacuum pump at 25° C. Then, the fraction (100.0 g) obtained in Example 2-2 and antimony pentachloride (18.0 g) were dropwise added from the dropping funnel, followed by reflux with heating while the flask was stirred. Then, the reflux condenser was exchanged for a single distillation apparatus and distillation under reduced pressure was carried out to obtain a colorless and transparent liquid (87.6 g) as a fraction. The liquid was analyzed by $^{19}$F-NMR and as a result, it was confirmed to be the compound (y6-F).

Example 2-4

Preparation Example for Compound (m2-10F) by Dechlorination

Into a four-necked flask (internal capacity 500 mL, manufactured by glass) equipped with a mechanical stirrer, a dropping funnel, a thermocouple thermometer and a distillation column, a zinc powder (42.1 g) and dimethylformamide (120 g) were put and heated at 40° C. in water both. Then, 1,2-dibromoethane (16.1 g) was dropwise added to the system. After completion of acute heat generation, the internal temperature of the flask was kept at 55° C., and the colorless and transparent liquid (77.0 g) obtained in Example 2-3 was slowly dropwise added.

The entire compound (y6-F) was dropwise added while the balance between the amount of the fraction distilled from the column top of the distillation column and the addition amount of the compound (y6-F) was adjusted along with the progress of the reaction. The distilled fraction (32.1 g) which was a colorless and transparent liquid was analyzed by $^{19}$F-NMR and as a result, it was confirmed to be the compound (m2-10F). The yield was 52% as determined by gas chromatography. Further, as a result of measurement of the mass spectrum (CI method) of the fraction, a molecular ion peak was confirmed at m/z=288, and formation of the compound (m2-10F) was confirmed.

$^{19}$F-NMR (282.7 MHz, solvent: CDCl$_3$, standard: CFCl$_3$)
δ (ppm): −53.1 (2F), −87.7 (4F), −156.1 (2F).

Example 3

Production Example for CF$_2$=CH(CF$_2$)$_2$OCF=CF$_2$ (m3-23)

Example 3-1

Production Example for Compound (y11)

Into a three-necked flask (internal capacity 5 L) equipped with a dropping funnel and a stirrer, an aqueous solution (4,200 g) containing 14 mass % of sodium hypochlorite and trioctylmethylammonium chloride (19 g) were charged and stirred. Then, while the internal temperature of the flask was kept at lower than 10° C., CF$_2$=CFCF$_2$OCFClCF$_2$Cl (340 g) was dropwise added to the flask over a period of 30 minutes and stirred, and after completion of the dropwise addition, stirring was carried out further for 2 hours.

Then, the supernatant liquid of the solution in the flask was removed by decantation, followed by washing with water to obtain a reaction liquid (244 g). The reaction liquid was analyzed by NMR and GC and as a result, formation of the title compound (yield 59%) was confirmed. Further, unreacted CF$_2$=CFCF$_2$OCFClCF$_2$Cl (yield 10%) was recovered.

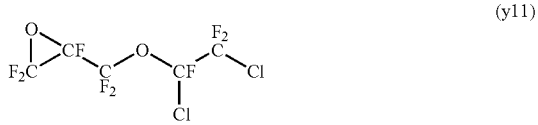

(y11)

$^{19}$F-NMR (282.7 MHz, solvent: CDCl$_3$, standard: CFCl$_3$)
δ (ppm): −71.0 (2F), −76.8 (1F), −80.0 (2F), −109.9 (1F) −111.8 (1F), −155.8 (1F).

Example 3-2

Production Example for FCOCF$_2$CF$_2$OCFClCF$_2$Cl

Into a four-necked flask (internal capacity 2 L) equipped with a dropping funnel, a reflux condenser, a stirrer and a temperature controlled bath in a nitrogen gas atmosphere, CsF (53 g), diglyme (1,400 g) and water (3.1 g) were charged and stirred. Then, the reaction liquid (containing 500 g of the compound (y11)) obtained by the method in Example 3-1 was dropwise added to the flask with stirring at 25° C.

2 hours later, the reflux condenser was exchanged for a straight pipe directly connected to a dry ice cold trap. The pressure was reduced while the temperature in the flask was kept at 25° C., whereupon a liquid (670 g) was obtained in the dry ice cold trap. The liquid was subjected to distillation under reduced pressure to obtain a fraction at 60° C./250 Pa. The fraction was analyzed by NMR and GC and as a result, formation of the title compound (yield 70%) was confirmed.

$^{19}$F-NMR (282.7 MHz, solvent: CDCl$_3$, standard: CFCl$_3$)
δ (ppm): 25.2 (1F), −70.3 (2F), −76.3 (1F), −84.3 (1F), −86.2 (1F), −122.0 (2F)

Example 3-3

Production Example for ICOCF$_2$CF$_2$OCFClCF$_2$Cl

Into a three-necked flask (internal capacity 500 mL) equipped with a dropping funnel, a reflux condenser and a stirrer, dipped in an oil bath in a nitrogen gas atmosphere, LiI (127 g) was charged, and then the fraction (390 g) obtained in Example 3-2 was charged with stirring. Then, the oil bath was heated to 100° C., and the solution in the flask was refluxed with heating for 1.5 hours, followed by cooling to 25° C.

The reflux condenser was exchanged for a straight tube having an ice water cold trap and a dry ice cold trap connected thereto in this order. The flask was heated to 80° C. while the pressure in the flask was reduced to 667 Pa, whereupon a liquid A (300 g) and a liquid B (130 g) were obtained in the ice water cold trap and the dry ice cold trap, respectively. The liquid A is analyzed by NMR and GC and as a result, formation of the title compound (yield 94%) was confirmed. Further, the liquid B is analyzed by NMR and GC and as a result, formation of CF$_2$=CFCF$_2$OCFClCF$_2$Cl was confirmed.

$^{19}$F-NMR (282.7 MHz, solvent: CDCl$_3$, standard: CFCl$_3$)
δ (ppm): −70.5 (2F), −76.7 (1F), −82.5 (1F), −84.5 (1F), −113.7 (2F).

Example 3-4

Production Example for ICF$_2$CF$_2$OCFClCF$_2$Cl

Into an autoclave (internal capacity 1 L, made of hastelloy C) dipped in an oil bath, the liquid A (290 g) obtained in Example 3-3 was charged. The autoclave was heated at 200° C., whereupon the internal pressure of the autoclave kept on increasing for 3 hours. Then, while the internal temperature of the autoclave was kept at 25° C., the solution in the autoclave was drawn to obtain a reaction crude liquid (270 g). Then, the reaction crude liquid was washed with a sodium sulfite aqueous solution (50 mL), water (50 mL) and a saturated salt solution (50 mL) in this order to obtain a crude product. The crude product was analyzed by GC and as a result, formation of the title compound (yield 98%) was confirmed. Further, the crude product was rectified to obtain a product with a purity of 99% as determined by GC, as a fraction at 37° C./0.93 kappa.

$^{19}$F-NMR (282.7 MHz, solvent: CDCl$_3$, standard: CFCl$_3$)
δ (ppm): −65.4 (2F), −70.9 (2F), −77.3 (1F), −86.0 (1F) −88.3 (1F).

Example 3-5

Production Example for ICF$_2$CH$_2$CF$_2$CF$_2$OCFClCF$_2$Cl

Into an autoclave (internal capacity 500 mL, made of nickel) dipped in an oil bath, the fraction (400 g) obtained by the method in Example 3-4, CF$_3$(CF$_2$)$_5$H (210 g) and ((CH$_3$)$_3$CO—)$_2$ (8 g) were charged. The autoclave was sealed, and gaseous CH$_2$=CF$_2$ (0.4 g) was added until the internal pressure became 0.05 MPa (gauge pressure). Then, the oil bath was heated and when the internal temperature of the autoclave exceeded 110° C., gaseous CH$_2$=CF$_2$ was charged to the autoclave at a flow rate of 10.4 g/h, and the internal temperature was increased to 120° C. with stirring. The internal pressure of the autoclave 5 hours later was 0.3 MPa (gauge pressure).

Stirring was carried out further for one hour, and the oil bath was removed so that the internal temperature of the autoclave was lowered to 25° C., and the content in the autoclave was drawn to obtain a reaction crude liquid. The reaction crude liquid was washed with a sodium sulfite aqueous solution (100 mL), water (100 mL) and a saturated salt solution (100 mL) in this order to obtain a crude product. The crude product was analyzed by GC and as a result, formation of the title compound (yield 40%) was confirmed. Further, unreacted ICF$_2$CF$_2$OCFClCF$_2$Cl (yield 26%) was recovered. The crude product was rectified to obtain a product with a purity of 99% as determined by GC.

Example 3-6

Production Example for CF$_2$=CHCF$_2$CF$_2$OCFClCF$_2$Cl

Into a four-necked flask (internal capacity 1 L) equipped with a dropping funnel, a temperature controlled bath and a distillation apparatus, ICF$_2$CH$_2$CF$_2$CF$_2$OCFClCF$_2$Cl (170 g) with a purity of 99% obtained in Example 3-5 and 1,4-dioxane (450 g) were charged. Then, N(CH$_2$CH$_2$CH$_2$CH$_3$)$_3$ (90 g) was dropwise added at 25° C. with stirring, and after completion of the dropwise addition, stirring was carried out further for 1 hour to obtain a reaction crude liquid. The reaction crude liquid was analyzed by GC and as a result, formation of the title compound was confirmed. The reaction crude liquid was distilled under reduced pressure, followed by washing with a saturated salt solution (500 mL) to obtain a reaction liquid. The reaction liquid was analyzed by GC and as a result, the yield was 98%.

Example 3-7

Production Example for CF$_2$=CHCF$_2$CF$_2$OCF=CF$_2$

Into a four-necked flask (internal capacity 1 L) equipped with a dropping funnel and a reflux condenser having a container to collect a refluxed liquid, Zn (120 g) and dimethylformamide (360 g) were charged with stirring. Then, the internal temperature of the flask was increased to 60° C., and 1,2-dibromoethane (37 g) was charged, followed by stirring for 30 minutes. Then, the pressure in the flask was reduced to 26.7 kappa, and CF$_2$=CHCF$_2$CF$_2$OCFClCF$_2$Cl (120 g) obtained in Example 3-6 was slowly dropwise added from the dropping funnel, whereupon a liquid (80 g) was distilled in the container. The liquid (80 g) was analyzed by NMR and GC and as a result, formation of the title compound (yield 85%) was confirmed. The liquid was rectified to obtain a product with a purity of 99% as determined by GC, as a fraction at 20° C./1.33 kappa.

$^1$H-NMR (300.4 MHz, solvent: CDCl$_3$, standard: TMS) δ (ppm): 4.74 (1H).

$^{19}$F-NMR (282.7 MHz, solvent: CDCl$_3$, standard: CFCl$_3$) δ (ppm): −70.4 (1F), −71.8 (1F), −91.0 (2F), −111.9 (2F) −114.5 (1F), 122.8 (1F), 135.1 (1F).

Example 4

Production Example for Compound (a3)

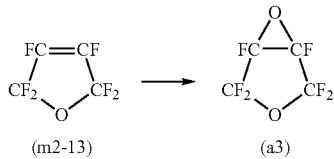

Into a flask equipped with a reflux condenser, a 12 mass % sodium hypochlorite aqueous solution (150 mL) was put. Then, acetonitrile (25 mL) was added. Then, the internal temperature was adjusted at 0° C., and the compound (m2-13) (16.3 g) was added. Stirring was carried out for 5 hours while the internal temperature during the reaction was adjusted at 0° C. Then, ten drops of trioctylmethylammonium chloride were added, followed by stirring at 0° C. further for 17 hours, and the flask was left at rest at 0° C. Then, the upper layer was drawn, and the lower layer was washed with a saturated sodium bicarbonate aqueous solution. After washing, the upper layer saturated sodium bicarbonate aqueous solution was drawn. Then, the compound (a3) (1.03 g) was obtained by distillation under reduced pressure. The product was analyzed by NMR and as a result, formation of the title compound (yield 3.3%) was confirmed.

$^{19}$F-NMR (282.7 MHz, solvent: CDCl$_3$, standard: CFCl$_3$) δ (ppm): −81.3 (2F), −95.0 (2F), −182.4 (2F).

Example 5

Production Example for Compound (a2)

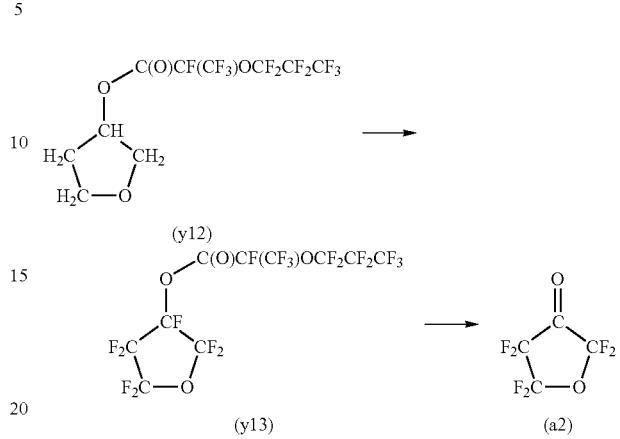

Example 5-1

Production Example for Compound (y12)

Into a flask, NaF (35.7 g), R-225 (176 g) and 3-hydroxytetrahydrofuran (50.0 g) were put and stirred. While the internal temperature of the flask was kept at 0 to 10° C., CF$_3$CF$_2$CF$_2$OCF(CF$_3$)COF (245 g) was dropwise added to the flask over a period of 4 hours. After completion of the dropwise addition, stirring was carried out at 25° C. further for 4 hours, and then while the internal temperature of the flask was kept at 15° C. or below, a saturated sodium hydrogen carbonate aqueous solution (100 mL) was added to obtain a solution.

The solution was extracted with R-225 (200 mL) three times, and the obtained extract was dehydrated by magnesium sulfate, concentrated and distilled under reduced pressure to obtain a fraction (201 g) at 63.5° C./933 Pa. The fraction was analyzed by NMR and as a result, formation of the compound (y12) was confirmed (yield 92.4%).

$^1$H-NMR of the compound (y12) (300.4 MHz, solvent: CDCl$_3$, standard: TMS) δ (ppm): 2.08 (m, 1H), 2.28 (m, 1H), 3.95 (m, 4H), 5.55 (m, 1H).

$^{19}$F-NMR of the compound (y12) (282.7 MHz, solvent: CDCl$_3$, standard: CFCl$_3$) δ (ppm): −80.0 (1F), −81.3 (3F), −82.8 (3F), −86.8 (1F), −130.2 (2F), −132.0 (1F).

Example 5-2

Production Example for Compound (y13)

Into an autoclave (500 mL, made of nickel), R-113 (312 g) was added, stirred and kept at 25° C. At the autoclave gas outlet, a condenser kept at 20° C., a NaF pellet packed bed and a condenser kept at −10° C. were installed in series. A liquid return line to recover a condensed liquid from the condenser kept at −10° C. to the autoclave was installed. A nitrogen gas was blown for one hour, and then a fluorine gas (hereinafter referred to as 20% fluorine gas) diluted to 20% by a nitrogen gas was blown at 10.8 L/h for one hour.

Then, while the 20% fluorine gas was blown to the autoclave at the same flow rate, a solution having the fraction (10 g) obtained in Example 5-1 dissolved in R-113 (100 g) was injected over a period of 3.5 hours. Then, the outlet valve of the autoclave was closed, and while the 20% fluorine gas was blown at the same flow rate, 9 ml of an R-113 solution at a benzene concentration of 0.01 g/mL was injected with heating from 25° C. to 40° C. The benzene inlet of the autoclave and the outlet valve of the autoclave were closed, and after the pressure in the autoclave was elevated to 0.20 MPa, the fluorine gas inlet valve of the autoclave was closed, followed by stirring for 0.4 hour. Then, the pressure was recovered to normal pressure, and while the internal temperature of the reactor was kept at 40° C., 6 mL of the above benzene solution was injected, the benzene inlet of the autoclave was closed, and the outlet valve of the autoclave was closed. When the pressure became 0.20 MPa, the fluorine gas inlet valve of the autoclave was closed, followed by stirring for 0.4 hour. The same operation was repeatedly carried out three times. The total amount of benzene injected was 0.33 g, and the total amount of R-113 injected was 33 mL.

After a nitrogen gas was blown to the autoclave for one hour, the content in the autoclave was analyzed and as a result, formation of the compound (y13) was confirmed (yield 60%).

$^{19}$F-NMR (282.7 MHz, solvent: CDCl$_3$, standard: CFCl$_3$) δ (ppm): −78.0 to 90.0 (4F), −79.9 (1F), −81.9 (6F), −84.0 (1F), −124.0 to 130.0 (2F), −130.2 (2F), −132.2 (1F), −135.0 (1F).

Example 5-3

Production Example for Compound (a2)

Into a flask equipped with a distillation column, the compound (y13) (139.4 g) and a KF powder (3.2 g) were put by the method in Example 5-2. The flask was heated (100° C.) under atmospheric pressure for 8 hours while the solution in the flask was stirred, to obtain a crude product. The crude product was analyzed by $^{19}$F-NMR and as a result, formation of the compound (a2) was confirmed (yield 82%). The crude product was distilled under reduced pressure and as a result, a compound (a2) was obtained as a fraction at 6.0° C./93.33 kappa.

$^{19}$F-NMR (282.7 MHz, solvent: CDCl$_3$, standard: CFCl$_3$) δ (ppm): −80.0 (2F), −85.5 (2F), −125.7 (2F).

Polymer Production Examples (Examples 6 to 19)

Structures corresponding to monomer units in the following Polymer Production Examples are as follows:

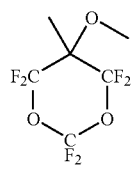
(A1-1)

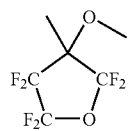
(A2)

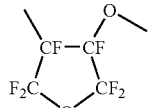
(A3)

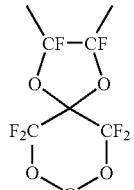
(M2-10F)

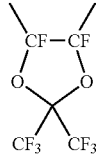
(M2-11)

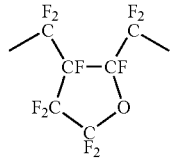
(M3-21)

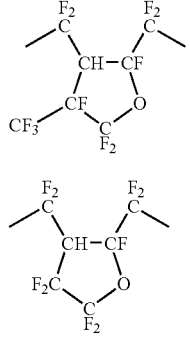
(M3-22)

(M3-23)

Example 6

Production Example for Polymer (A1-1) by Copolymerization of Compound (a1-1) and Compound (m3-22)

Into an autoclave (internal capacity 100 mL, made of stainless steel), perfluoro(2-butyltetrahydrofuran) (6 g), CF$_2$=CHCF(CF$_3$)CF$_2$OCF=CF$_2$ (compound (m3-22), 10 g) and ((CF$_3$)$_3$CO—)$_2$ (70 mg) as a polymerization initiator were charged, and the interior of the autoclave was flushed with a nitrogen gas. Then, the autoclave was cooled to −78° C. in a dry ice/ethanol bath, and the product (8.0 g) containing the compound (a1-1) obtained in Example 1-3 was charged. Then, the autoclave was pressurized to 0.2 MPa (gauge pressure) by a nitrogen gas, and then heated at 100° C. to carry out polymerization for 66 hours, and further heated at 120° C. to carry out polymerization for 24 hours, to obtain polymer (A1-1) (7.1 g).

The polymer (A1-1) was analyzed by $^1$H-NMR and $^{19}$F-NMR and as a result, formation of a polymer containing the units (A1-1) and the units (M3-22) and the like was confirmed, since a peak of fluorine atoms bonded to carbon atoms constituting unsaturated bonds in the polymer (A1-1) completely disappeared, and a 6-membered cyclic structure was held. The proportion of the units (A1-1) was 12 mol %, and the proportion of the units (M3-22) and the like formed by cyclopolymerization of the compound (m3-22) was 88 mol %, to all the units in the polymer (A1-1). The polymer (A1-1) had Mw of 20,000 and $T_g$ of 76° C. The polymer (A1-1) was a tough and transparent vitreous polymer at 25° C.

Example 7

Production Example for Polymer (A1-2) by Copolymerization of Compound (a1-1) and Compound (m2-10F)

Into an autoclave (internal capacity 100 mL, made of stainless steel), perfluoro(2-butyltetrahydrofuran) (40 g), the compound (m2-10F) (6.5 g) obtained in Example 2-4 and an R-225 solution (1.2 g) containing 3 mass % of $(C_3F_7COO)_2$ as a polymerization initiator were charged, and the interior of the autoclave was flushed with a nitrogen gas. Then, the autoclave was cooled to −78° C. in a dry ice/ethanol bath, and the product (4.0 g) containing the compound (a1-1) obtained in Example 1-3 was charged. Then, the autoclave was pressurized to 0.3 MPa (gauge pressure) by a nitrogen gas, and heated at 25° C. to carry out polymerization for 56 hours, to obtain polymer (A1-2) (6.4 g).

The polymer (A1-2) was analyzed by $^{19}$F-NMR and as a result, formation of a polymer containing the units (A1-1) and the units (M2-10F) was confirmed, since a peak of fluorine atoms bonded to carbon atoms constituting unsaturated bonds in the polymer (A1-2) completely disappeared, and a 6-membered cyclic structure was held. The proportion of the units (A1-1) was 13 mol %, and the proportion of the units (M2-10F) was 87 mol %, to all the units in the polymer (A1-2). Further, the polymer (A1-2) had an intrinsic viscosity of 3.4 dl/g in perfluoro(methyldecalin) at 30° C., and $T_g$ of 230° C. The polymer (A1-2) was a tough and transparent vitreous polymer at 25° C.

Example 8

Production Example for Polymer (A1-3) by Copolymerization of Compound (a1-1) and Compound (m3-22)

Into an autoclave (made of stainless steel, internal capacity 100 mL), perfluoro(2-butyltetrahydrofuran) (10 g), the compound (m3-22) (10 g) and $((CF_3)_3CO—)_2$ (100 mg) as a polymerization initiator were charged, and the interior of the autoclave was flushed with a nitrogen gas. Then, the autoclave was cooled to −78° C. in a dry ice/ethanol bath, and the product (12.0 g) containing the compound (a1-1) obtained in Example 1-3 was charged. Then, the interior of the autoclave was pressurized to 0.2 MPa (gauge pressure) by a nitrogen gas, and the autoclave was heated at 110° C. to carry out polymerization for 15 hours, and further heated at 130° C. to carry out polymerization for 10 hours, to obtain polymer (A1-3) (4.3 g).

The polymer (A1-3) was analyzed by $^{19}$F-NMR and as a result, formation of a polymer containing the units (A1-1) and the units (M3-22) and the like was confirmed, since a peak of fluorine atoms bonded to carbon atoms constituting unsaturated bonds in the polymer (A1-3) completely disappeared, and a 6-membered cyclic structure was held. Further, the proportion of the units (A1-1) was 56 mol %, and the proportion of the units (M3-22) and the like derived from a compound (m3-22) formed by cyclopolymerization of the compound (m3-22) was 44 mol %, to all the units in the polymer (A1-3). Further, the polymer (A1-3) had Mw of 7,500 and $T_g$ of 57° C. The polymer (A1-3) was a tough and transparent vitreous polymer at 25° C.

Example 9

Production Example for Polymer (A1-20) Formed by Introducing Carboxyl Group to Polymer (A1-2)

The polymer (A1-2) obtained by the method in Example 7 was charged to a hot-air oven, followed by treatment in an oxygen gas atmosphere at 300° C. for 2 hours, and the polymer was immersed in pure water at 100° C. for 24 hours. The polymer was vacuum dried at 100° C. for 24 hours to obtain a polymer. Formation of a polymer (A1-20) having carboxyl groups introduced to the polymer (A1-2) was confirmed since absorption corresponding to a carboxyl group was confirmed in an IR spectrum of the polymer.

Example 10

Production Example for Polymer (A1-5) Formed by Introducing Carboxyl Group to Polymer (A1-3)

A polymer was obtained in the same manner as in Example 9 except that the polymer (A1-3) obtained by a method in Example 8 was used and that vacuum drying was carried out at temperature of 80° C. Formation of a polymer (A1-5) having carboxyl groups introduced to the polymer (A1-3) was confirmed by an IR spectrum of the polymer. The proportion of carboxyl groups present in the polymer (A1-5) was 0.0005 mol/g.

Example 11

Production Example for Polymer (A1-4) by Copolymerization of Compound (a1-1) and Compound (m2-11)

Into an autoclave (internal capacity 100 mL, made of stainless steel), perfluoro(2-butyltetrahydrofuran) (50 g), the above-mentioned compound (m2-11) (5 g) and an R-225 solution (2 g) containing 3 mass % of $(C_3F_7COO)_2$ as a polymerization initiator were charged, and the interior of the autoclave was flushed with a nitrogen gas. Then, the autoclave was cooled to −78° C. in a dry ice/ethanol bath, and the product (10.0 g) containing the compound (a1-1) obtained in Example 1-3 was charged. Then, the autoclave was pressurized to 0.3 MPa (gauge pressure) by a nitrogen gas, and heated at 25° C. to carry out polymerization for 56 hours, to obtain polymer (A1-4) (4.7 g).

As a result of $^{19}$F-NMR measurement of the polymer (A1-4), formation of a polymer containing the units (A1-1) and the units (M2-11) was confirmed, since a peak of fluorine atoms bonded to carbon atoms constituting unsaturated bonds completely disappeared, and a 6-membered cyclic structure was held. Further, the proportion of the units (A1-1) was 2 mol %, and the proportion of the units (M2-11) was 98 mol %, to all the units in the polymer (A1-4). The polymer (A1-4) had an intrinsic viscosity of 0.6 dl/g in perfluoro(methyldecalin) at 30° C. and $T_g$ of 316° C. The polymer (A1-4) was a tough and transparent vitreous polymer at 25° C. Further, the transmittance of a substrate made of calcium fluoride, on which a coating film (thickness 1 μm) of the polymer (A1-4) was formed, was at least 90% to a light having a wavelength of 157 nm.

Example 12

Production Example for Polymer (A1-6) by Copolymerization of Compound (a1-1) and $CF_2=CHF_2CF_2OCF=CF_2$ Into a pressure resistant glass reactor (internal capacity 50 mL), $CF_2=CHF_2CF_2OCF=CF_2$ (compound (m3-23), 13.6 g) and $((CF_3)_3CO-)_2$ (307 mg) as a polymerization initiator were charged, and the interior of the pressure resistant glass reactor was flushed with a nitrogen gas. Then, the pressure resistant glass reactor was cooled to −78° C. in a dry ice/ethanol bath, and the product (16.5 g) containing the compound (a1-1) obtained in Example 1-3 was charged. Then, the interior of the system was freeze-deaerated by liquid nitrogen, followed by heating at 110° C. to carry out polymerization for 18 hours, to obtain polymer (A1-6) (8.4 g).

As a result of $^{19}F$-NMR measurement of the polymer (A1-6), the polymer (A1-6) was confirmed to be a polymer containing the units (A1-1) and the units (M3-23) and the like, since a peak of fluorine atoms bonded to carbon atoms constituting unsaturated bonds completely disappeared, and a 6-membered cyclic structure was held. Further, the proportion of the units (A1-1) was 34 mol %, and the proportion of the units (M3-23) and the like derived from the compound (m3-23) formed by cyclopolymerization of the compound (m3-23) was 66 mol %, to all the units in the polymer (A1-6). Further, the polymer (A1-6) had Mw of 9,900 and $T_g$ of 55° C. The polymer (A1-3) was a white powdery polymer at 25° C.

Example 13

Production Example for Polymer (A1-7) by Copolymerization of Compound (a1-1) and Compound (m3-23)

The interior of an ampoule (internal capacity 10 mL, made of glass) was flushed with a nitrogen gas, and the ampoule was cooled to −78° C. Then, an R-225 solution (3.3 g) containing 3 mass % of $(C_3F_7COO-)_2$, the compound (m3-23) (5.5 g) and the compound (a1-1) (4.5 g) were put and the ampoule was sealed. The ampoule was dipped in a warm water bath at 20° C., whereupon polymerization was carried out for 48 hours to obtain polymer (A1-7) (0.5 g).

The polymer (A1-7) was analyzed by NMR and as a result, formation of a polymer containing the units (A1-1) and the units (M3-23) and the like was confirmed since a peak of fluorine atoms bonded to carbon atoms constituting unsaturated bonds completely disappeared, and a 6-membered cyclic structure was held. The polymer (A1-7) had $M_w$ of 17,000 and $T_g$ of 61° C. The polymer (A1-7) was a tough and transparent vitreous polymer at 25° C. The transmittance of a substrate made of calcium fluoride on which a coating film (thickness 1 μm) of the polymer (A1-7) was formed, was at least 95% to a light having a wavelength of 157 nm.

Example 14

Production Example for Polymer (A1-8) by Copolymerization of Compound (a1-1) and Compound (m3-21)

The interior of an autoclave (internal capacity 100 mL, made of stainless steel) was flushed with a nitrogen gas, and the pressure was reduced. Then, R-113 (50 g), $CF_2=CFCF_2CF_2OCF=CF_2$ (m3-21) (13 g) and $((CF_3)_3CFO-)_2$ (0.1 g) were put. The compound (a1-1) (13.2 g) was put while the internal temperature of the autoclave was kept at −78° C.

Then, a nitrogen gas was charged to the autoclave to elevate the internal pressure of the autoclave to 0.2 MPa (gauge pressure). Then, while the internal temperature of the autoclave was kept at from 90° C. to 110° C., polymerization was carried out for 34 hours to obtain polymer (A1-8) (10.6 g).

Formation of a polymer containing the units (A1-1) and the units (M3-21) was confirmed by NMR of the polymer (A1-8). The proportion of the units (A1-1) was 3 mol %, and the proportion of the units (M3-21) and the like was 97 mol %, to all the units in the polymer (A1-8). The polymer (A1-8) had an intrinsic viscosity of 0.13 (dL/g) in perfluoro(2-butyltetrahydrofuran) at 30° C., and $T_g$ of 97° C. The polymer (A1-8) was a tough and transparent vitreous polymer at 25° C. Further, the transmittance of a substrate made of calcium fluoride on which a coating film (thickness 1 μm) of the polymer (A1-8) was formed, was at most 5% to a light having a wavelength of 157 nm.

Example 15

Production Example for Polymer (A1-9) by Copolymerization of Compound (a1-1) and $CH_2=CF_2$ The interior of an autoclave (internal capacity 200 mL, made of stainless steel) was flushed with a nitrogen gas, and the pressure was reduced at −40° C. or below. Then, R-113 (30 g), an R-225 solution (0.7 g) containing 3 mass % of $(C_3F_7COO-)_2$, the liquid compound (a1-1) (4.9 g) and gaseous $CH_2=CF_2$ (1.7 g) were put.

Then, a nitrogen gas was introduced to the autoclave to elevate the internal pressure of the autoclave to 0.5 MPa (gauge pressure). Then, while the internal temperature of the autoclave was kept at 20° C., polymerization was carried out for 42 hours to obtain polymer (A1-9) (3.3 g).

By NMR of the polymer (A1-9), formation of a polymer containing the units (A1-1) and monomer units of vinylidene fluoride was confirmed, since a signal of a 6-membered ring derived from the compound (a1-1) and a signal (−60 ppm) based on the structure $-(OCF_2)-$ were confirmed. The proportion of the units (A1-1) was 33 mol %, and the proportion of the monomer units of vinylidene fluoride was 67 mol % to all the units in the polymer (A1-9). The polymer (A1-9) had $M_w$ of 46,000 and $T_g$ of 6° C. The polymer (A1-9) was a highly extendable transparent vitreous polymer at 10° C. The transmittance of the polymer (A1-9) in the form of a film (thickness 1 μm) was at least 98% to a light having a wavelength of 157 nm.

Example 16

Production Example for Polymer (A1-10) by Copolymerization of Compound (a1-1), $CH_2=CF_2$ and Compound (m3-21)

The interior of an autoclave (internal capacity 200 ml, made of stainless steel) was flushed with a nitrogen gas, and the pressure was reduced at −40° C. or below. Then, R-113 (34 g), an R-225 solution (0.6 g) containing 3 mass % of $(C_3F_7COO-)_2$, the compound (a1-1) (5.4 g), the liquid compound (m3-21) (1.7 g) and gaseous $CH_2=CF_2$ (1.1 g) were charged to an autoclave.

Then, a nitrogen gas was charged to an autoclave to elevate the internal pressure of the autoclave to 0.5 MPa (gauge pressure). While the internal temperature of the autoclave was kept at 20° C., polymerization was carried out for 32 hours to obtain polymer (A1-10) (4.9 g).

By NMR of the polymer (A1-10), formation of a polymer containing the units (A1-1), monomer units of $CF_2=CH_2$ and the units (M3-21) was confirmed. The proportion of the units (A1-1) was 30 mol %, the proportion of the monomer units of $CF_2=CH_2$ was 60 mol %, and the proportion of the units (M3-21) and the like was 10 mol %, to all the units in the polymer (A1-10). The polymer (A1-10) had $M_w$ of 70,000 and $T_g$ of 21° C. The polymer (A1-10) was a transparent and tough vitreous polymer at 25° C. Further, the transmittance of a substrate made of calcium fluoride on which a coating film (thickness 1 μm) of the polymer (A1-10) was formed, was at least 70% to a light having a wavelength of 157 nm.

Example 17

Production Example for Polymer (A1-11) by Copolymerization of Compound (a1-1), $CH_2=CF_2$ and Compound (m2-11)

The interior of an autoclave (internal capacity 200 mL, made of stainless steel) was flushed with a nitrogen gas, and the pressure was reduced at −40° C. or below. Then, R-113 (40 g), an R-225 solution (0.75 g) containing 3 mass % of $(C_3F_7COO-)_2$, the compound (a1-1) (3.8 g), the compound (m2-11) (3.7 g) and gaseous $CH_2=CF_2$ (0.9 g) were put in the autoclave.

A nitrogen gas was charged to the autoclave to elevate the internal pressure of the autoclave to 0.6 MPa (gauge pressure). Then, while the internal temperature of the autoclave was kept at 20° C., polymerization was carried out for 24 hours to obtain polymer (A1-11) (4.3 g).

By NMR of the polymer (A1-11), formation of a polymer containing the units (A1-1), monomer units of $CF_2=CH_2$ and the units (M2-11) was confirmed. The proportion of the units (A1-1) was 10 mol %, the proportion of the monomer units of $CF_2=CH_2$ was 30 mol %, and the proportion of the units (M2-11) and the like was 60 mol %, to all the units in the polymer (A1-11). The polymer (A1-11) had Mw of 151,000 and $T_g$ of 88° C. The polymer (A1-11) was a transparent and tough vitreous polymer at 25° C. Further, the transmittance of a substrate made of calcium fluoride on which a coating film (thickness 1 μm) of the polymer (A1-11) was formed, was at least 97% to a light having a wavelength of 157 nm.

Example 18

Production Example for Polymer (A2-1) by Copolymerization of Compound (a2) and $CH_2=CF_2$ The interior of an autoclave (internal capacity 100 mL, made of stainless steel) was flushed with a nitrogen bath, and the pressure was reduced at −40° C. or below. Then, R-113 (34 g), an R-225 solution (0.75 g) containing 3 mass % of $(C_3F_7COO)_2$, the liquid compound (a2) (5.1 g) and gaseous $CH_2=CF_2$ (2 g) were put.

Then, a nitrogen gas was introduced to the autoclave to elevate the internal pressure of the autoclave to 0.5 MPa (gauge pressure). Then, while the internal temperature of the autoclave was kept at 20° C., polymerization was carried out for 32 hours to obtain polymer (A2-1) (3.6 g).

By NMR of the polymer (A2-1), formation of a polymer containing the units (A2) was confirmed, since a signal of a 5-membered ring derived from the compound (a2) and a signal (−59 ppm) based on the structure —$(OCF_2)$— were confirmed.

The proportion of the units (A2) was 33 mol %, and the proportion of the monomer units of $CF_2=CH_2$ was 67 mol % to all the units in the polymer (A2-1). The polymer (A2-1) had $M_w$ of 42,000 and $T_g$ of 18° C. The polymer (A2-1) was a transparent vitreous polymer at 20° C. The transmittance of the polymer (A2-1) in the form of a film (thickness 1 μm) was at least 98% to a light having a wavelength of 157 nm.

Example 19

Production Example for Polymer (A3-1) by Polymerization of Compound (a3)

The interior of a four-necked flask (internal capacity 50 mL, made of glass) equipped with a thermometer, a magnetic stirrer and a condenser was flushed with a nitrogen gas. Then, dry cesium fluoride (0.02 g), tetraglyme (0.5 g) and hydrous tetrahydrofuran (1 g) were charged. Then, while the internal temperature of the four-necked flask was kept at −20° C. or below, the compound (a3) (2 g) was put in the four-necked flask with stirring. Stirring was carried out for 12 hours while the internal temperature of the flask was kept at −30° C., and stirring was carried out for 8 hours while the internal temperature was kept at −20° C., and stirring was carried out further for 72 hours while the internal temperature was kept at −10° C., to carry out polymerization.

Tetraglyme and tetrahydrofuran in the solution in the four-necked flask were removed by decantation, and solids in the flask were recovered. The solids were dissolved in R-225 (10 mL) and then purified by reprecipitation (solvent: hexane (150 mL)). The purified solids were vacuum dried at 40° C. to obtain polymer (A3-1) (0.8 g).

By NMR of the polymer (A3-1), formation of a polymer containing the units (A3) was confirmed, since a signal derived from the epoxy structure derived from the compound (a3) completely disappeared, and a 5-membered cyclic structure was held. The polymer (A3-1) had $T_g$ of 40° C., and was a transparent polymer at 25° C. Further, the transmittance of a substrate made of calcium fluoride on which a coating film (thickness 1 μm) of the polymer (A3-1) was formed, was at least 65% to a light having a wavelength 157 nm.

Example 20

Production Example for Polymer (A3-2) by Polymerization of Compound (a3)

Into a four-necked flask (internal capacity 50 mL, made of glass) equipped with a thermometer, a magnetic stirrer and a condenser in a nitrogen gas atmosphere, $CsOCF_2CF_2CF_2OCs$ (0.05 g) and tetraglyme (0.04 g) were added. While the internal temperature of the flask was kept at −20° C. or below, the compound (a3) (2.5 g) was added to the flask with stirring.

Stirring was carried out at a flask internal temperature of −30° C. for 19 hours, then stirring was carried out at −20° C. for 12 hours and stirring was carried out at −10° C. further for 26 hours, and then stirring was carried out at 0° C. for 60 hours to carry out polymerization.

The content in the flask was dissolved in R-225 (10 mL), followed by reprecipitation (solvent: hexane (150 mL)), and the obtained solids were vacuum dried at 60° C. to obtain polymer (A3-2) (2.45 g).

As a result of NMR measurement of the polymer (A3-2), formation of a polymer containing the units (A3) was confirmed since a signal derived from the epoxy structure derived from the compound (a3) completely disappeared, and a 5-membered cyclic structure was held. The polymer (A3-2) had Mw of 11,000 and $T_g$ of 56° C. The polymer (A3-2) was a transparent polymer at 25° C. Further, the transmittance of a substrate made of calcium fluoride on which a coating film (thickness 1 μm) of the polymer (A3-1) was formed, was at least 65% to a light having a wavelength of 157 nm. Further, even if a $F_2$ excimer laser light (wavelength 157 nm) was applied to the coating film in a total irradiation amount of at least 100 J/cm$^2$, the transmittance of the coating film was at least 40% to a light having a wavelength of 157 nm.

Pellicle Production Examples (Examples 21 to 24)

Example 21

Production Examples for Substrates (A1-1) to (A1-3)

The polymer (A1-1) (2 g) obtained in Example 6 and perfluoro(tributylamine) (18 g) were charged to a glass flask and heated and stirred at 40° C. for 24 hours to obtain a colorless and transparent solution. This solution was applied to a polished quartz substrate by spin coating for 10 seconds at a spinning speed of 500 rpm and then for 20 seconds at 700 rpm to obtain a treated substrate having the surface of the quartz substrate coated with the polymer (A1-1). This treated substrate heated at 80° C. for one hour and further heated at 180° C. for 1 hour and dried to obtain substrate (A1-1) on the surface of which a uniform and transparent coating film of the polymer (A1-1) was formed.

In the same manner, using the polymer (A1-2) obtained in Example 7, substrate (A1-2) on the surface of which a uniform and transparent coating film of the polymer (A1-2) was formed was obtained. Further, in the same manner, using the polymer (A1-3) obtained in Example 8, substrate (A1-3) on the surface of which a uniform and transparent coating film of the polymer (A1-3) was formed was obtained.

Example 22

Production Example for Pellicle Using Polymer (A1-21) for Adhesive and Each of Polymers (A1-1) to (A1-3) for Pellicle Membrane The polymer (A1-21) (2 g) obtained in Example 10 and perfluoro(2-butyltetrahydrofuran) (38 g) were charged to a flask (made of glass), heated and stirred at 40° C. for 24 hours to obtain a colorless and transparent solution, which was used as an adhesive. The solution was applied to a side on which a pellicle membrane would be boned of a frame (made of aluminum), and dried at 25° C. for 2 hours. Further, the frame was placed on a hot plate at 120° C. so that the surface to which the adhesive was applied faced upward, followed by heating at 120° C. for 10 minutes.

Then, the coating film surface of the substrate (A1-1) obtained in Example 20 and the adhesive side of the frame were contacted and contact-bonded, followed by heating at 120° C. for 10 minutes so that the frame and the coating film surface were completely bonded. Then, the quartz substrate was separated from the substrate (A1-1). As a result, pellicle (A1-1) comprising a uniform self-supporting film (thickness 1 μm) of the polymer (A1-1) bonded to the frame by means of the polymer (A1-21) was obtained.

In the same manner, pellicle (A1-2) comprising a uniform self-supporting film (thickness 1 μm) of the polymer (A1-2) bonded to a frame by means of the polymer (A1-21) was obtained. In the same manner, pellicle (A1-3) comprising a uniform self-supporting film (thickness 1 μm) of the polymer (A1-3) bonded to a frame by means of the polymer (A1-21) was obtained.

The transmittance to a $F_2$ excimer laser having a wavelength of 157 nm was at least 80% in the case of the pellicle (A1-1), at least 85% in the case of the pellicle (A1-2) and at least 85% in the case of the pellicle (A1-3).

Example 23

Example for Evaluation of Pellicles (A1-1) to (A1-3)

Each of the pellicles (A1-1) to (A1-3) obtained in Example 21 is subjected to an irradiation test by means of a $F_2$ excimer laser with an intensity of 0.05 mJ/pulse at a cycle of 200 Hz. Each of the pellicles (A1-1) to (A1-3) shows excellent durability without no substantial decrease in transmittance with at least 600,000 pulses. Further, the pellicle membrane and the frame are strongly bonded by means of the polymer (A1-21) in each pellicle.

Example 24

Example for Production and Evaluation of Pellicle (A1-6) Using Polymer (A1-6)

The polymer (A1-6) (8 g) obtained in Example 18 and perfluoro(tributylamine) (92 g) were put in a glass flask and heated and stirred at 40° C. for 24 hours. As a result, a colorless and transparent uniform solution without turbidity was obtained. This solution was applied to a Si substrate by spin coating for 10 seconds at a spinning speed of 500 rpm and then for 20 seconds at 1,000 rpm, followed by heat treatment for one hour at 80° C. and further for one hour at 180° C. to obtain a uniform transparent membrane on the Si substrate.

A solution prepared in the same manner as above using the polymer (A1-21) (4 g) obtained in Example 10, perfluoro (tributylamide) (48 g) and perfluorooctane (48 g), was applied to an aluminum frame and dried at 25° C. for 4 hours. Then, the aluminum frame was placed on a hot plate at 130° C. so that the adhesive side faced upward, followed by heating for 10 minutes, so that the surface on which the membrane of the polymer (A1-6) was formed of the Si substrate, was contact bonded to the frame. Further, the assembly was held in an oven at 130° C. for 10 minutes and then at 200° C. for one hour to complete bonding. Then, the assembly with the frame bonded to the membrane, was dipped in pure water and put in an oven at 50° C. for one day. Then, the membrane was separated from the Si substrate, followed by vacuum drying at 70° C. for seven days to obtain a thin membrane comprising a uniform self-supporting membrane made of the polymer (A1-6) with a thickness of about 1 μm bonded to the aluminum frame, as pellicle (A1-6). The transmittance of the thin membrane was measured and as a result, the transmittance of the thin membrane to a light having a wavelength of 157 nm is 95%.

Further, the pellicle (A1-6) is subjected to an irradiation test by means of a $F_2$ excimer laser having a wavelength of 157 nm and as a result, the pellicle membrane shows excellent durability.

INDUSTRIAL APPLICABILITY

The fluorinated polymer (I) of the present invention is a novel polymer excellent in transparency and durability to a short wavelength light (particularly a $F_2$ excimer laser). The novel polymer (I) is useful for e.g. a pellicle membrane and an adhesive. By a pellicle employing the fluoropolymer of the present invention, an exposure treatment in production of semiconductor apparatus and liquid crystal display panels can be carried out with a high yield, and useful semiconductor apparatus and liquid crystal display panels can be provided. Further, according to the present invention, a novel compound useful as a monomer, a novel polymer and their production methods are provided.

The entire disclosures of Japanese Patent Application No. 2003-404403 filed on Dec. 13, 2003, Japanese Patent Application No. 2004-120237 filed on Apr. 15, 2004 and Japanese Patent Application No. 2004-225707 filed on Aug. 2, 2004 including specifications, claims and summaries are incorporated herein by reference in their entireties.

What is claimed is:

1. A compound represented by the following formula (a2):

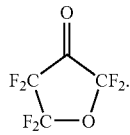

(a2)

2. A method for producing a polymer containing a monomer unit represented by the following formula (A2), which comprises polymerizing a compound represented by the following formula (a2):

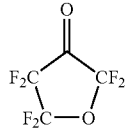

(a2)

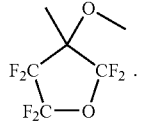

(A2)

* * * * *